United States Patent
Baek et al.

(10) Patent No.: US 11,575,009 B2
(45) Date of Patent: Feb. 7, 2023

(54) SEMICONDUCTOR DEVICE HAVING HIGH VOLTAGE TRANSISTORS

(71) Applicant: SAMSUNG ELECTRONICS CO., LTD., Suwon-si (KR)

(72) Inventors: Sungkweon Baek, Hwaseong-si (KR); Taeyoung Kim, Seoul (KR); Hakseon Kim, Seoul (KR); Kangoh Yun, Hwaseong-si (KR); Changhoon Jeon, Goyang-si (KR); Junhee Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 16/822,389

(22) Filed: Mar. 18, 2020

(65) Prior Publication Data
US 2021/0028283 A1    Jan. 28, 2021

(30) Foreign Application Priority Data
Jul. 23, 2019   (KR) .................. 10-2019-0089099

(51) Int. Cl.
*H01L 29/10*    (2006.01)
*H01L 29/08*    (2006.01)
(Continued)

(52) U.S. Cl.
CPC ...... *H01L 29/1041* (2013.01); *H01L 29/0847* (2013.01); *H01L 29/1095* (2013.01);
(Continued)

(58) Field of Classification Search
CPC . H01L 2224/45099; H01L 2224/48132; H01L 2224/48175; H01L 2224/48177; H01L 2224/48465; H01L 2224/81399; H01L 2224/85399; H01L 23/3107; H01L 23/49575; H01L 24/05; H01L 24/16; H01L 24/17; H01L 27/11529; H01L 27/11539; H01L 27/11575; H01L 28/40; H01L 28/60; H01L 29/24; H01L 29/42324; H01L 29/4234; H01L 29/42352; H01L 29/4966;
(Continued)

(56) References Cited

U.S. PATENT DOCUMENTS 7,163,855 B2    1/2007 Noda et al.
7,465,989 B2    12/2008 Hayashi
(Continued)

FOREIGN PATENT DOCUMENTS

KR    10-0923033    10/2009

*Primary Examiner* — Maliheh Malek
(74) *Attorney, Agent, or Firm* — F. Chau & Associates, LLC

(57) ABSTRACT

A semiconductor device includes a gate structure disposed on a substrate. The gate structure has a first sidewall and a second sidewall facing the first sidewall. A first impurity region is disposed within an upper portion of the substrate. The first impurity region is spaced apart from the first sidewall. A third impurity region is within the upper portion of the substrate. The third impurity region is spaced apart from the second sidewall. A first trench is disposed within the substrate between the first sidewall and the first impurity region. The first trench is spaced apart from the first sidewall. A first barrier insulation pattern is disposed within the first trench.

17 Claims, 26 Drawing Sheets

(51) Int. Cl.
*H01L 29/66* (2006.01)
*H01L 29/06* (2006.01)
*H01L 29/423* (2006.01)
*H01L 29/78* (2006.01)

(52) U.S. Cl.
CPC ...... *H01L 29/4236* (2013.01); *H01L 29/0653* (2013.01); *H01L 29/66575* (2013.01); *H01L 29/66659* (2013.01); *H01L 29/7833* (2013.01)

(58) Field of Classification Search
CPC ........... H01L 29/4983; H01L 29/66553; H01L 29/66628; H01L 29/7786; H01L 29/7787; H01L 29/7838; H01L 29/8648; H01L 29/8611; H01L 2924/01022; H01L 2924/013; H01L 2924/04941; H01L 2029/42388; H01L 21/00; H01L 21/02532; H01L 21/0465; H01L 21/2652; H01L 21/31; H01L 21/76; H01L 21/762; H01L 21/76829; H01L 21/76832; H01L 21/76895; H01L 21/8236; H01L 21/823864; H01L 2224/05553; H01L 2224/05554; H01L 2224/06051; H01L 2224/48091; H01L 2224/4811; H01L 2224/48111; H01L 2224/48137; H01L 2224/48247; H01L 2224/48257; H01L 2224/49112; H01L 2224/4917; H01L 2224/8319; H01L 23/043; H01L 23/3157; H01L 23/4824; H01L 23/4952; H01L 23/49562; H01L 23/49568; H01L 23/535; H01L 23/60; H01L 23/62; H01L 24/32; H01L 24/83; H01L 25/072; H01L 25/16; H01L 25/18; H01L 27/0883; H01L 27/0924; H01L 27/0928; H01L 27/098; H01L 27/10; H01L 27/1122; H01L 27/11582; H01L 28/00; H01L 29/0626; H01L 29/0886; H01L 29/41775; H01L 29/518; H01L 29/66325; H01L 29/66348; H01L 29/66484; H01L 29/66613; H01L 29/66719; H01L 29/7391; H01L 29/7392; H01L 29/749; H01L 29/76; H01L 29/7803; H01L 29/781; H01L 29/7848; H01L 29/78639; H01L 29/7866; H01L 29/788; H01L 29/7887; H01L 2924/01078; H01L 2924/01079; H01L 2924/12036; H01L 2924/13091; H01L 2924/19107; H01L 2924/3011; H01L 21/02164; H01L 21/02595; H01L 21/22; H01L 21/261; H01L 21/28035; H01L 21/28097; H01L 21/3081; H01L 21/3086; H01L 21/31144; H01L 21/321; H01L 21/743; H01L 21/76254; H01L 21/76264; H01L 21/76283; H01L 21/8222; H01L 21/82345; H01L 21/823487; H01L 21/8238; H01L 2224/27013; H01L 2224/1919; H01L 2224/83051; H01L 2224/83801; H01L 2224/8385; H01L 23/36; H01L 27/0825; H01L 27/11531; H01L 27/1158; H01L 27/12; H01L 29/0673; H01L 29/0804; H01L 29/1004; H01L 29/107; H01L 29/1079; H01L 29/267; H01L 29/41708; H01L 29/41725; H01L 29/42316; H01L 29/42332; H01L 29/42356; H01L 29/42392; H01L 29/4916; H01L 29/4975; H01L 29/51; H01L 29/66333; H01L 29/66439; H01L 29/6678; H01L 29/73; H01L 29/7302; H01L 29/732; H01L 29/7925; H01L 29/7395; H01L 29/775; H01L 29/7815; H01L 29/7823; H01L 29/7826; H01L 29/7827; H01L 29/78621; H01L 29/78657; H01L 29/01013; H01L 2924/01015; H01L 2924/01018; H01L 2924/01019; H01L 2924/0102; H01L 2924/01023; H01L 2924/01024; H01L 2924/01029; H01L 2924/01033; H01L 2924/0104; H01L 2924/01041; H01L 2924/01042; H01L 2924/01046; H01L 2924/01047; H01L 2924/01051; H01L 2924/01073; H01L 2924/01075; H01L 2924/014; H01L 2924/0665; H01L 2924/07802; H01L 2924/10158; H01L 2924/10253

See application file for complete search history.

(56) References Cited

U.S. PATENT DOCUMENTS

| | | | |
|---|---|---|---|
| 8,268,691 B2* | 9/2012 | Tien | H01L 29/7835 257/E29.268 |
| 8,350,318 B2* | 1/2013 | Grivna | H01L 29/42368 257/329 |
| 9,324,846 B1* | 4/2016 | Camillo-Castillo | H01L 29/0817 |
| 9,525,045 B1* | 12/2016 | Lee | H01L 29/66734 |
| 9,754,950 B2* | 9/2017 | Lee | H01L 29/66537 |
| 9,812,569 B2* | 11/2017 | Chen | H01L 29/0847 |
| 9,824,759 B2* | 11/2017 | Kwon | G11C 16/0483 |
| 10,032,765 B1 | 7/2018 | Solaro et al. | |
| 10,593,754 B2* | 3/2020 | Singh | H01L 21/265 |
| 2007/0075362 A1* | 4/2007 | Wu | H01L 29/7813 257/E29.155 |
| 2008/0258226 A1* | 10/2008 | Ishiguro | H01L 29/0653 257/E27.059 |
| 2010/0200930 A1* | 8/2010 | Fujii | H01L 21/823418 257/E21.627 |
| 2011/0278662 A1 | 11/2011 | Park et al. | |
| 2012/0168863 A1* | 7/2012 | Zhu | H01L 27/1203 257/E21.409 |
| 2013/0175594 A1* | 7/2013 | Basker | H01L 27/10861 438/155 |
| 2014/0027841 A1* | 1/2014 | Bhalla | H01L 29/407 257/330 |
| 2015/0021682 A1* | 1/2015 | Bobde | H01L 29/7827 438/270 |
| 2015/0035061 A1* | 2/2015 | Yoon | H01L 29/785 257/365 |
| 2015/0091083 A1* | 4/2015 | Poelzl | H01L 29/66795 438/270 |
| 2015/0162411 A1* | 6/2015 | Schulze | H01L 21/76877 438/294 |
| 2015/0179655 A1* | 6/2015 | Nakanishi | H01L 27/283 438/269 |
| 2016/0086804 A1* | 3/2016 | Noguchi | H01L 29/0696 438/270 |
| 2016/0322370 A1* | 11/2016 | Lee | H01L 29/66537 |
| 2017/0125583 A1* | 5/2017 | Hsiao | H01L 29/0653 |
| 2017/0271467 A1* | 9/2017 | Kono | H01L 21/0485 |
| 2018/0151672 A1* | 5/2018 | Choi | H01L 27/11524 |
| 2019/0139980 A1* | 5/2019 | Kim | G11C 16/3431 |
| 2019/0139983 A1* | 5/2019 | Lee | H01L 27/11524 |
| 2019/0237526 A1* | 8/2019 | Kim | H01L 27/1248 |
| 2019/0312052 A1* | 10/2019 | Lee | H01L 27/11573 |
| 2020/0035785 A1* | 1/2020 | Singh | H01L 21/76267 |
| 2020/0052109 A1* | 2/2020 | Blank | H01L 21/76832 |
| 2020/0365560 A1* | 11/2020 | Kanamori | H01L 24/80 |

(56) References Cited

U.S. PATENT DOCUMENTS

2021/0193654 A1* 6/2021 Park ................. H01L 29/66439
2021/0343596 A1* 11/2021 Yang ............... H01L 21/823412

* cited by examiner

SEMICONDUCTOR DEVICE HAVING HIGH VOLTAGE TRANSISTORS

CROSS-REFERENCE TO RELATED APPLICATION

This application claims priority under 35 USC § 119 to Korean Patent Application No. 10-2019-0089099, filed on Jul. 23, 2019 in the Korean Intellectual Property Office (KIPO), the contents of which are incorporated by reference herein in their entirety.

TECHNICAL FIELD

The present disclosure relates to a semiconductor device and, more particularly, to a semiconductor de-ice including high voltage transistors.

DISCUSSION OF THE RELATED ART

A semiconductor device may include a memory cell region in which memory cells are formed and peripheral regions in which peripheral circuits for driving the memory cells are formed. The peripheral circuit formed in the peripheral region may include a high voltage transistor that is configured to be operated by a voltage within a range of several Volts to several tens of Volts. The high voltage transistor may have excellent operating characteristics and may be formed in a small limited area of a substrate.

SUMMARY

A semiconductor device includes a gate structure disposed on a substrate. There is a first impurity region at an upper portion of the substrate. A third impurity region is also at the upper portion of the substrate. A first trench is disposed within the substrate and a first barrier insulation pattern is disposed in the first trench.

The gate structure may have a first sidewall and a second sidewall facing the first sidewall. The first impurity region may be spaced apart from the first sidewall. The third impurity region may be spaced apart from the second sidewall. The first trench may be disposed within the substrate between the first sidewall and the first impurity region. The first trench may be spaced apart from the first sidewall.

A semiconductor device includes a gate structure formed on a substrate. A first impurity region is formed within the substrate. A second impurity region is formed within the substrate. A third impurity region is formed within the substrate. A fourth impurity region is formed within the substrate and a first barrier insulation pattern.

The first impurity region may be spaced apart from a first sidewall of the gate structure. The second impurity region may be formed within the substrate between the first sidewall and the first impurity region. The second impurity region may be connected to the first impurity region. The third impurity region play be formed within the substrate. The third impurity region may be spaced apart from a second sidewall facing the first sidewall of the gate structure. The fourth impurity region may be formed within the substrate between the second sidewall and the third impurity region. The fourth impurity region may be connected to the third impurity region. The first barrier insulation pattern may fill a first trench formed within the substrate between the first sidewall and the first impurity region. The first barrier insulation pattern may be spaced apart from the first sidewall of the gate structure. The second impurity region may be formed along a surface of the substrate contacting the first barrier insulation pattern.

A semiconductor device includes a gate structure formed on a substrate. A first impurity region is formed within an upper portion of the substrate. A second impurity region is formed within the substrate. A third impurity region is formed at an upper portion of the substrate. A fourth impurity region is formed within the substrate. The semiconductor device further includes an insulating interlayer and first and second contact plugs.

The first impurity region may be spaced apart from a first sidewall of the gate structure. The second impurity region may be formed within the substrate between the first sidewall and the first impurity region. The second impurity region may be connected to the first impurity region. The third impurity region may be formed at an upper portion of the substrate. The third impurity region may be spaced apart from a second sidewall facing the first sidewall of the gate structure. The fourth impurity region may be formed within the substrate between the second sidewall and the third impurity region. The fourth impurity region may be connected to the third impurity region. The first barrier insulation pattern may fill a first trench formed within the substrate between the first sidewall and the first impurity region. The insulating interlayer may at least partially cover the gate structure on the substrate. The first and second contact plugs may each pass through the gate insulation layer. The first and second contact plugs may contact the first impurity region and the third impurity region, respectively. The first barrier insulation pattern may be spaced apart from the first side wall. The first to fourth impurity regions may be doped with impurities of the same conductivity type.

BRIEF DESCRIPTION OF THE DRAWINGS

A more complete appreciation of the present disclosure and many of the attendant aspects thereof will be more clearly understood from the following detailed description taken in conjunction with the accompanying drawings, wherein.

DETAILED DESCRIPTION OF THE DRAWINGS

Figure 1:
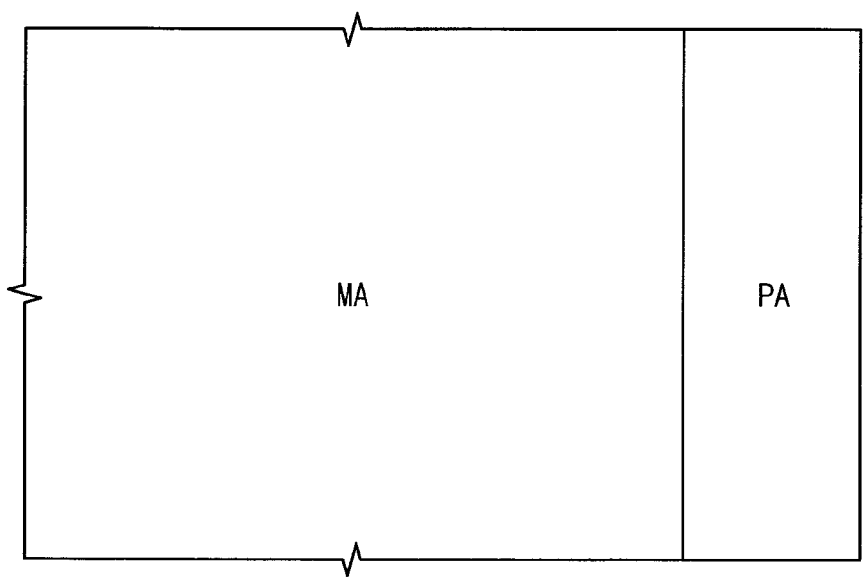
FIG. 1 is a plan view illustrating a semiconductor device in accordance with exemplary embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. FIG. 1 is a plan view illustrating a semiconductor device in accordance with exemplary embodiments of the present disclosure.

Referring to FIG. 1, the semiconductor device may include a memory cell region MA and a peripheral region PA disposed on at least one side of the memory cell region MA. Memory cells formed in the memory cell region MA may have a three-dimensional structure or a two-dimensional structure. Peripheral circuits such as transistors, resistor structures, capacitors and inductors may be formed in the peripheral region PA. For example, one of the transistors may include a high voltage transistor that is configured to be operated by a voltage of several Volts to several tens of Volts.

Figure 2:
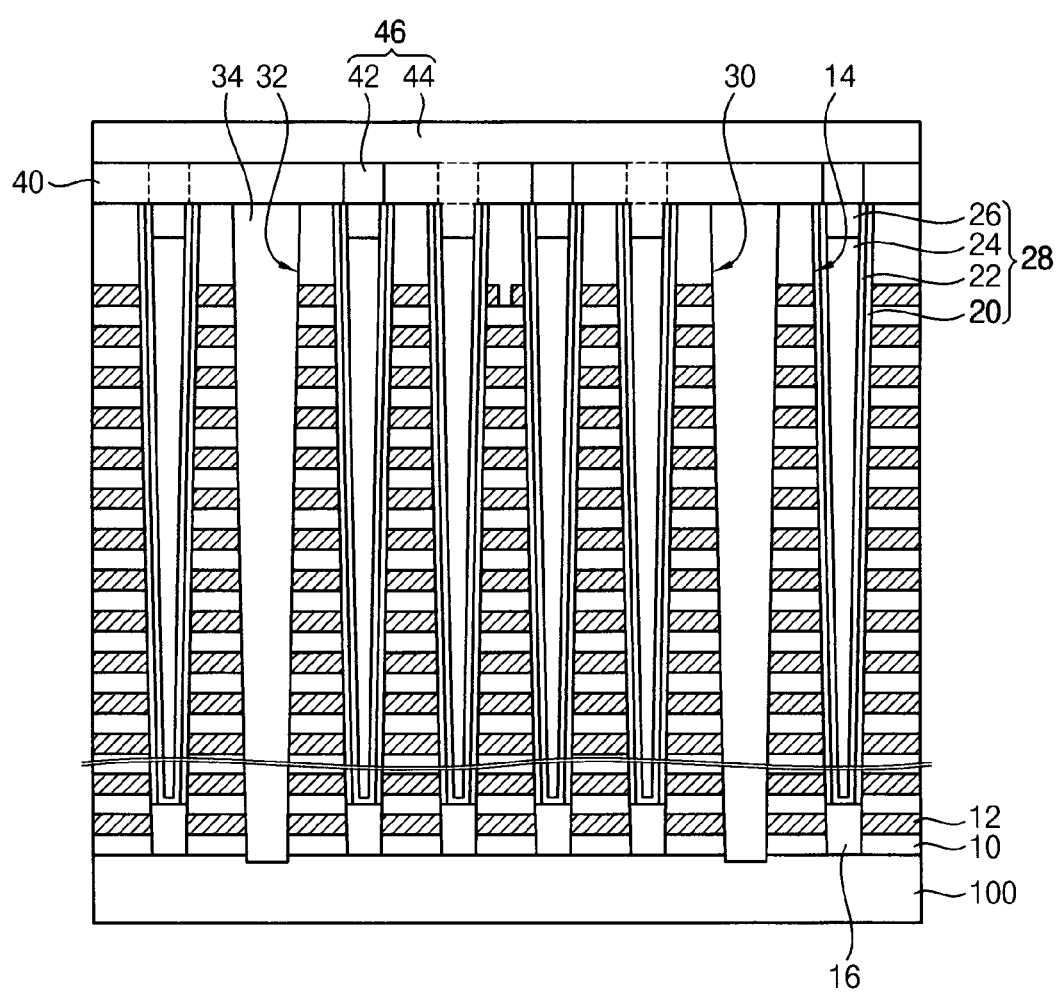
FIG. 2 is a cross-sectional view illustrating an example of memory cells formed in the memory cell region, shown in FIG. 1.

FIG. 2 is a cross-sectional view illustrating an example of memory cells formed in the memory cell region shown in FIG. 1.

In exemplary embodiments of the present disclosure, the semiconductor device may be a NAND flash memory device, and the memory cells may include vertical memory cells.

Referring to FIG. 2, the vertical memory cell may include a stacked structure 30 formed on a substrate 100 and a channel structure 28 passing through the stacked structure 30. The channel structure 28 may include a channel 22. Also, an upper insulation layer 40 may be formed on the stacked structure 30. In addition, a bit line structure 46 may be formed on the stacked structure 30 to be electrically connected to the channel 22 in the channel structures 28. The bit line structure 46 may include a bit line contact 42 and a bit line 44.

The stacked structure 30 may include insulation layers 10 and gate electrodes 12 alternately and repeatedly stacked. In exemplary embodiments of the present disclosure, a trench 32 may be disposed between a plurality of stacked structures 30, and an insulation pattern 34 may fill the trench 32.

The gate electrodes 12 may serve, as gates of cell transistors.

The channel structure 28 may pass through the stacked structure 30. The channel structure 28 may be formed in a channel hole 14 passing through the stacked structure 30 and extending to an upper surface of the substrate 100.

In exemplary embodiments of the present disclosure, a semiconductor pattern 16 may be further formed on a bottom of the channel hole 14, and the semiconductor pattern 16 may contact the upper surface of the substrate 100. In some exemplary embodiments of the present disclosure, the semiconductor pattern 1 might not be formed on the bottom of the channel hole 14.

The channel structure 28 may include a data storage structure 20, a channel 22, a filling insulation pattern 24 and an upper conductive pattern 26. The upper conductive pattern 26 may be formed at an upper portion of the channel hole 14, and the upper conductive pattern 26 may be electrically connected to the channel 22.

The data storage structure 20 may include a blocking layer, a charge storage layer, and a tunnel insulation layer, which may be sequentially stacked from a sidewall of the channel hole 14. The blocking layer may contact the gate electrode 12.

The channel 22 may be electrically connected to the substrate 100.

In the above, an example of a memory cell of a vertical NAND flash memory device is illustrated. However, the structure of the memory cell may be of any known type.

Further, the semiconductor device need not be a vertical NAND flash memory device. For example, the semiconductor device may be a memory device such as a planar type flash memory device, a DRAM device, or an SRAM device. According to the semiconductor device, the structure of the memory cells formed in the cell region may be changed.

Figure 3:
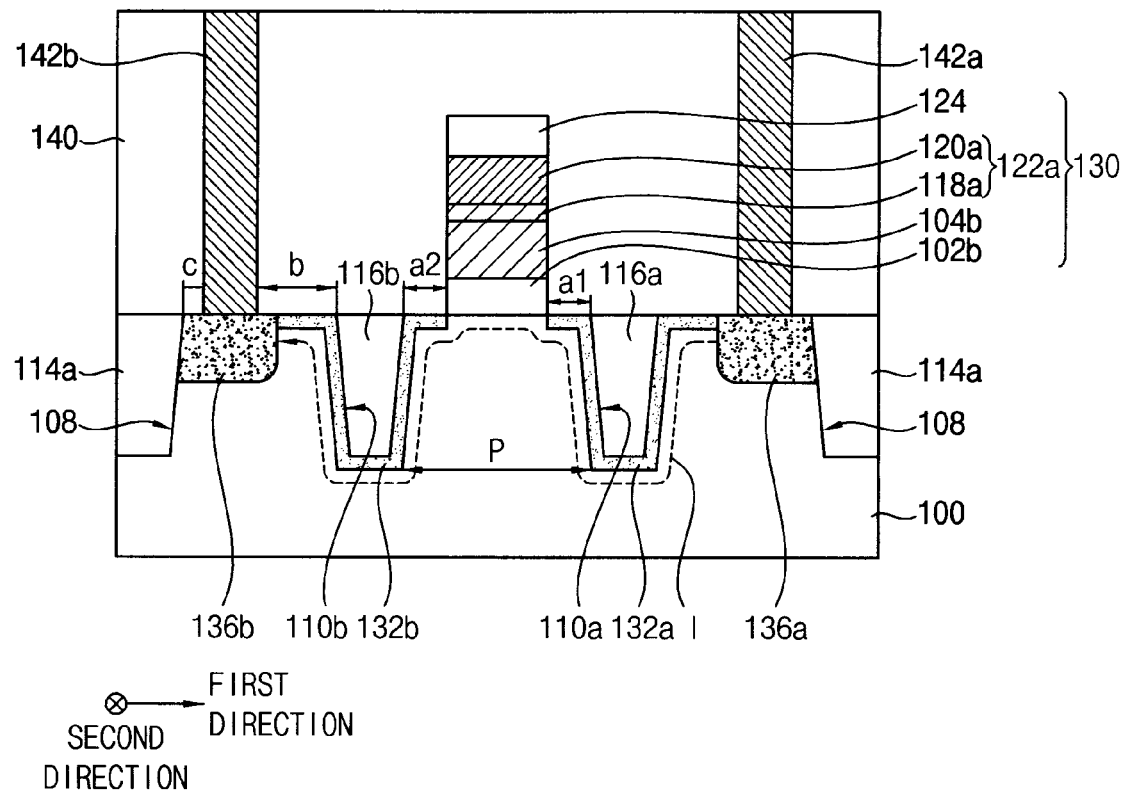
FIG. 3 is a cross-sectional view illustrating a high voltage transistor in accordance with exemplary embodiments of the present disclosure.
Figure 4:
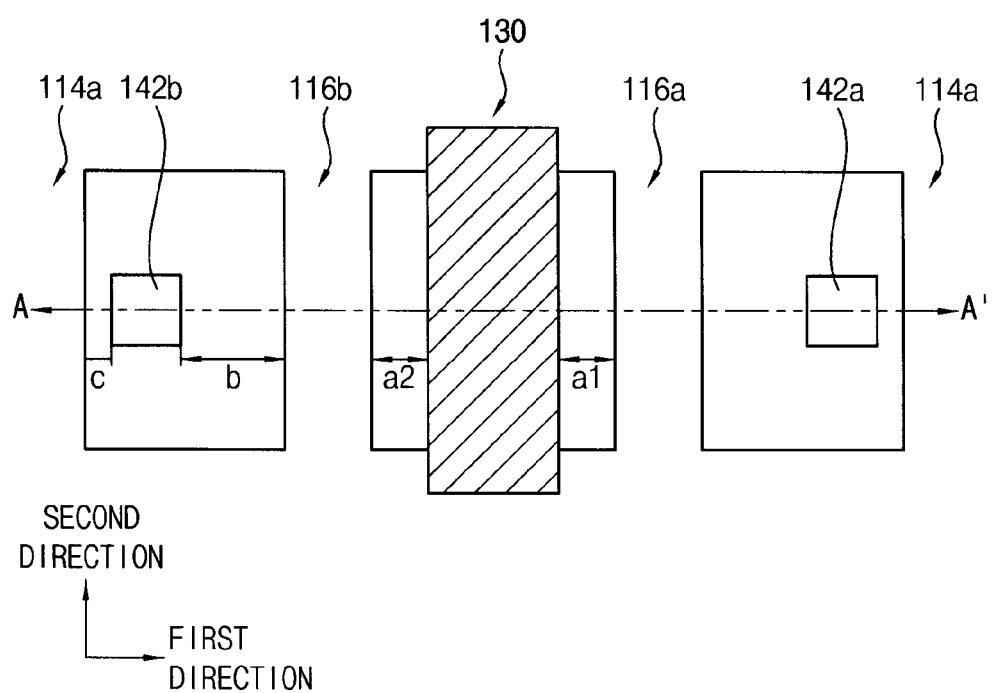
FIG. 4 is a plan view illustrating a high voltage transistor in accordance with exemplary embodiments of the present disclosure.

FIGS. 3 and 4 are a cross-sectional view and a plan view illustrating a high voltage transistor in accordance with exemplary embodiments of the present disclosure, respectively. FIG. 3 is a cross-sectional view taken along the line A-A' of FIG. 4. The high voltage transistor may be disposed in the peripheral region shown in FIG. 1.

Referring to FIGS. 3 and 4, the high voltage transistor may be formed on the substrate in the peripheral region PA, and the high voltage transistor may include a gate structure 130, a first barrier insulation pattern 116a, a second barrier insulation pattern 116b and impurity regions 132a, 132b, 136a and 136b. An insulating interlayer 140 covering the high voltage transistor may be formed con the substrate 100. A first contact plug 142a and a second contact plug 142b may pass through the insulating interlayer 140, and each of the first and second contact plugs 142a and 142b may contact at least a portion of the impurity regions 132a, 132b, 136a and 136b.

Hereinafter, a channel length direction of the high voltage transistor is referred to as a first direction, and a channel width direction of the high voltage transistor is referred to as a second direction.

An isolation trench 108 may be formed within the substrate 100 in the peripheral region PA, and an isolation pattern 114a may be formed in the isolation trench 108. The isolation pattern 114a may include an insulation material, e.g., silicon oxide, silicon nitride, etc. The isolation pattern 114a may serve as a field region, and an upper surface of the substrate 100 on which the isolation pattern 114a is not formed may serve as an active region. The high voltage transistor may be formed on the active region.

The gate structure 130 may be formed on the active region, and may be disposed to cross the active region. The gate structure 130 may extend in the second direction.

The gate structure 130 may include a gate insulation pattern 102b and a gate pattern stacked on the gate insulation pattern 102b. The gate pattern may include one layer or multiple layers.

In exemplary embodiments of the present disclosure, the gate insulation pattern 102b may include silicon oxide.

Its exemplary embodiments of the present disclosure, the gate pattern may include a first gate pattern 104b including lower polysilicon and a second gate pattern 122a including upper polysilicon and a metal. The first gate pattern 104b may directly contact the gate insulation pattern 102b. The first gate pattern 104b may include polysilicon doped with impurities.

In exemplary embodiments of the present disclosure, the gate pattern may have a structure including a first polysilicon pattern 104b, a second polysilicon pattern 118a and a metal suicide pattern 120a that are stacked. In this case, the first polysilicon pattern may serve as the first gate pattern 104b, and the second polysilicon pattern 118a and the metal silicide pattern 120a may serve as the second gate pattern 122a.

In some exemplary embodiments of the present disclosure, the gate pattern may have a structure including a first polysilicon pattern, a second polysilicon pattern, a barrier metal pattern and a metal pattern that are stacked. In some exemplary embodiments of the present disclosure, the gate pattern may have a structure including the first polysilicon pattern, the barrier metal pattern and the metal pattern that are stacked.

In some exemplary embodiments of the present disclosure, the gate insulation pattern 102b may include a metal oxide having a high dielectric constant. When the gate insulation pattern 102b includes the metal oxide having a high dielectric constant, the gate pattern directly contacting the gate insulation pattern 102b may include a metal.

In exemplary embodiments of the present disclosure, sidewalls of the gate structure 130 in the first direction may have no bent portion or no protrusion. For example, the sidewalls of the gate structure 130 in the first direction may extend to have predetermined slopes.

In exemplary embodiments of the present disclosure, a hard mask pattern 124 may be further formed on the gate pattern. The hard mask pattern 124 may include, e.g., silicon oxide or silicon nitride.

First and second trenches 110a and 110b may be formed within the substrate 100. The first and second trenches 110a and 110b may be spaced apart from the sidewalls of the gate structure 130 in the first direction, respectively. Therefore, an upper surface of the substrate 100 between the first trench 110a and the gate structure 130 and the upper surface of the substrate 100 between the second trench 110b and the gate structure 130 may be substantially flat. The first and second barrier insulation patterns 116a and 116b may be formed in the first and second trenches 110a and 110b, respectively. The first and second barrier insulation patterns 116a and 116b may fill the first and second trenches 110a and 110b, respectively. The first and second barrier insulation patterns 116a and 116b may include, e.g., silicon oxide. Thus, the gate structure 130 and the first barrier insulation patterns 116a may be spaced apart from each other, and the gate structure 130 and the second barrier insulation patterns 116b may be spaced apart from each other.

For example, the first barrier insulation pattern 116a may be spaced apart from a first sidewall of the gate structure 130 in the first direction. The second barrier insulation pattern 116b may be spaced apart from a second sidewall fitting the first sidewall of the gate structure 130.

Further, the active region of the substrate 100 disposed between the first sidewall of the gate structure 130 and the first barrier insulation pattern 116a and the active region of the substrate 100 disposed between the second sidewall of the gate structure 130 and the second barrier insulation pattern 116b may have substantially flat upper surfaces. An edge of the gate structure 130 in the first direction and the first barrier insulation pattern 116a might not be overlapped with each other, and another edge of the gate structure 130 in the first direction and the second barrier insulation pattern 116b might not be overlapped with each other.

In exemplary embodiments of the present disclosure, bottoms of the first and second trenches 110a and 110b may be coplanar with each other. Thus, bottoms of the first barrier insulation pattern 116a and the second barrier insulation pattern 116b may be coplanar with each other.

The edge of the gate structure 130 and the first barrier insulation pattern 116a may be spaced apart from each other, and the another edge of the gate structure 130 and second barrier insulation patterns 116b may be spaced apart from each other. Thus, a distance in the first direction between the first barrier insulation pattern 116a and the second barrier insulation pattern 116b may be increased as compared with a case where each of the first and second barrier insulation patterns may be overlapped with the gate structure or a case where each of the first and second barrier insulation patterns and the gate structure might not be spaced apart from each other. For example, a distance p in the first direction between a bottom of the first barrier insulation pattern 116a and a bottom of the second barrier insulation pattern 116b may be increased.

In the case of the high voltage transistor, when the distance p between the bottom of the first barrier insulation pattern 116a and the bottom of the second barrier insulation pattern 116b is decreased, an unwanted channel path may be generated at a portion between a second impurity region 132a under the bottom of the first barrier insulation pattern 116a and a fourth impurity region 132b under the bottom of the second barrier insulation pattern 116b. Therefore, a punch-through may occur. Punch-though is the phenomenon within a transistor when the depletion layers around the drain and source regions merge into a single depletion region. The field underneath the gate, and the drain current, become strongly dependent on the drain-source voltage. Punch-through causes a rapidly increasing current with increasing drain-source voltage. Punch-through may be undesirable as it increases the output conductance and limits the maximum operating voltage of the transistor As described above, the distance p between the bottom of the first barrier insulation pattern 116a and the bottom of the second barrier insulation pattern 116b may increase. Thus, the distance between the second impurity region 132a and the fourth impurity region 132b disposed at a lower portion in the substrate 100 may be increased, so that the punch-through may decrease.

In exemplary embodiments of the present disclosure, a first distance a1 between the first sidewall of the gate structure 130 and the first barrier insulation pattern 116a may be substantially the same as a second distance a2 between the second sidewall of the gate structure 130 and the second barrier insulation patterns 116b.

In exemplary embodiments of the present disclosure, inner widths of the first trenches 110a and the second trenches 110b may be substantially the same. Thus, widths of the first and second barrier insulation patterns 116a and 116b may be substantially the same.

The first barrier insulation pattern 116a may be formed between the gate structure 130 and the first contact plug 142a, and the second barrier insulation pattern 116b may be formed between the gate structure 130 and the second contact plug 142b.

The impurity regions 132a, 132b, 136a, and 136b may include a first impurity region 136a, the second impurity region 132a, a third impurity region 136b and the fourth impurity region 132b.

The first impurity region 136a may be formed under a surface of the substrate 100 between the first barrier insulation pattern 116a and the isolation pattern 114a. For example, the first impurity region 136a may be spaced apart from the first sidewall of the gate structure 130.

The second impurity region 132a may be formed at an upper portion of the substrate along a surface of the first trench 110a. For example, the second impurity region 132a may be formed along the surface of the substrate 100 contacting the first barrier insulation pattern 116a. Also, the second impurity region 132a may be formed at the upper portion of the substrate 100 between the first sidewall of the gate structure 130 and the first barrier insulation pattern 116a and the upper portion of the substrate 100 between the first barrier insulation pattern 116a and the first impurity region 136a. Thus, the first and second impurity regions 136a and 132a may be connected to each other.

The third impurity region 136b may be formed under the surface of the substrate 100 between the second barrier insulation pattern 116b and the isolation pattern 114a. For example, the third impurity region 136b may be spaced apart from the second sidewall of the gate structure 130. Also, the second trench 110b may be disposed between the second sidewall and the third impurity region 136b.

The fourth impurity region 132b may be formed at the upper portion of the substrate 100 along the surface of the second trench 110b. For example, the fourth impurity region 132b may be formed along the substrate 100 under the second barrier insulation pattern 116b. Also, the fourth impurity region 132b may be formed at the upper portion of the substrate 100 between the second sidewall of the gate structure 130 and the second barrier insulation pattern 116b and the upper portion of the substrate 100 between the second barrier insulation pattern 116b and the third impurity region 136b. Thus, the third and fourth impurity regions 136b and 132b may be connected to each other.

In exemplary embodiments of the present disclosure, the first impurity region 136a may serve as a source region, and the second impurity region 132a may serve as a source extension region. The third impurity region 136b may serve as a drain region, and the fourth impurity region 132b may serve as a drain extension region.

Impurities doped in the first to fourth impurity regions 136a, 132a, 136b, and 132b may have the same conductivity type.

In exemplary embodiments of the present disclosure, impurity concentrations of the first and second impurity regions 136a and 132a may be different from each other. For example, the impurity concentration of the first impurity region 136a may be higher than the impurity concentration of the second impurity region 132a. Impurity concentrations of the third and fourth impurity regions 136b and 132b may be different from each other. For example, the impurity concentration of the third impurity region 136b may be higher than the impurity concentration of the fourth impurity region 132b. Also, impurity concentrations of the first and third impurity regions 136a and 136b may be higher than impurity concentrations of the second and fourth impurity regions 132a and 132b.

In exemplary embodiments of the present disclosure, the first impurity region 136a may be spaced apart from the first barrier insulation pattern 116a. In exemplary embodiments of the present disclosure, the first impurity region 136a may contact a portion of the isolation pattern 114a.

In exemplary embodiments of the present disclosure, the third impurity region 136b may be spaced apart from the second barrier insulation pattern 116b. Also, the third impurity region 136b may contact a portion of the isolation pattern 114a.

The first and second contact plugs 142a and 142b may contact the first and third impurity regions 136a and 136b, respectively.

In some exemplary embodiments of the present disclosure, a gate contact plug may contact an upper surface of the second gate pattern 122a of the gate, structure 130.

In exemplary embodiments of the present disclosure, a distance between the first contact plug 142a and the first barrier insulation pattern 116a may be greater than the distance between the first contact plug 142a and the isolation pattern 114a. Also, a distance b between the second contact plug 142b and the second barrier insulation pattern 116b may be greater than the distance c between the second contact plug 142b and the isolation pattern 114a.

In exemplary embodiments of the present disclosure, in the high voltage transistor, the barrier insulation patterns 116a and 116b and the impurity regions 136a, 132a, 136b, and 132b may be symmetric with respect to the gate structure 130.

The high voltage transistor may include the first and second barrier insulation patterns 116a and 116b, so that an effective distance of the source extension region and an effective distance of the drain extension region may be increased. Also, an effective distance from the first sidewall of the gate structure 130 to the first contact plug 142a and an effective distance from the second sidewall of the gate structure 130 to the second contact plug 142b may be increased.

The high voltage transistor may have a channel region at the surface of the substrate 100 under the gate structure 130. An effective distance between the channel region and the first contact plug 142a and an effective distance between the channel region and the second contact plug 142b may be increased, so that a resistance between the channel region and the first contact plug 142a and a resistance between the channel region and the second contact plug 142b may be increased. Thus, a breakdown voltage of the high voltage transistor formed in a limited area of the substrate may be raised.

Also, a distance between the first contact plug 142a and the first barrier insulation 116a may be greater than a distance between the first contact plugs 142a and the isolation patterns 114a. Also, a distance between the second contact plug 142b and the second barrier insulation pattern 116b may be greater than a distance between the second contact plugs 142b and the isolation patterns 114a. Thus, the breakdown voltage of the high voltage transistor may be raised.

In addition, the distance p between the bottom of the first barrier insulation pattern 116a and the bottom of the second barrier insulation pattern 116b may be increased, so that the punch-through of the high voltage transistor may decrease.

The high voltage transistor, in accordance with exemplary embodiments of the present disclosure, may be used to operate the memory cells illustrated with reference to FIG. 2. For example, the high voltage transistor may be used as a switching device for supplying a voltage to the gate electrode of a cell transistor.

Figure 5:
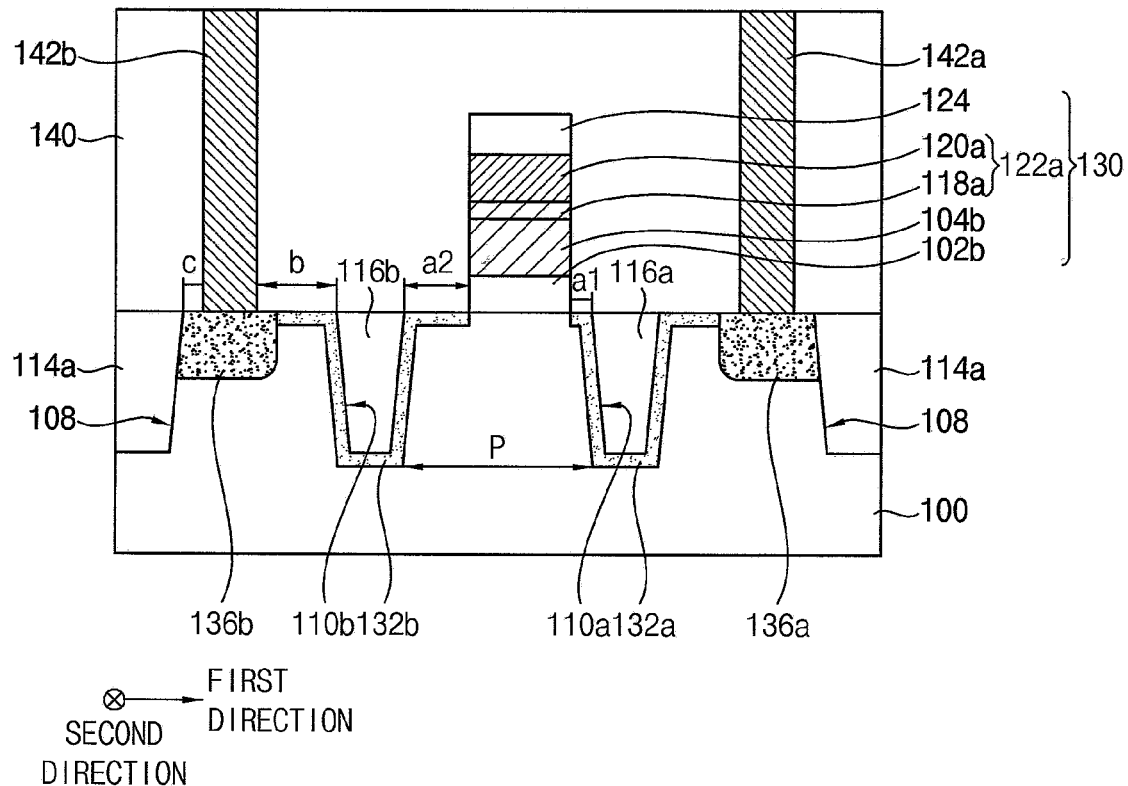
FIG. 5 is a cross-sectional view illustrating a high voltage transistor in accordance with exemplary embodiments of the present disclosure.
Figure 6:
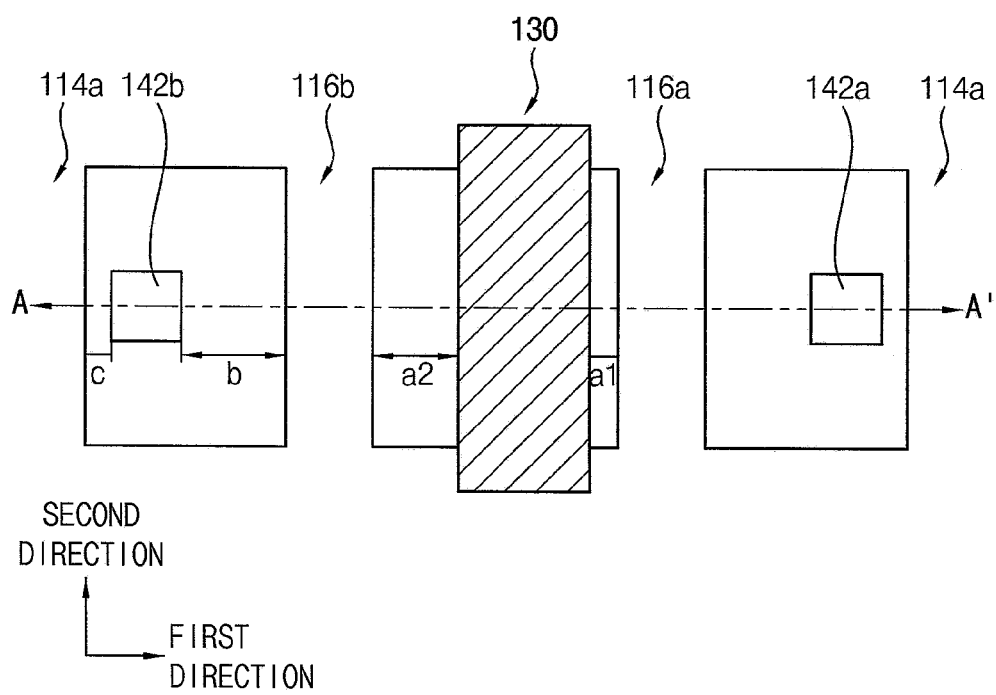
FIG. 6 is a plan view illustrating a high voltage transistor in accordance with exemplary embodiments of the present disclosure.

FIGS. 5 and 6 are a cross-sectional view and a plan view illustrating a high voltage transistor in accordance with exemplary embodiments of the present disclosure, respectively. FIG. 5 is a cross-sectional view taken along the line A-A' of FIG. 6.

The high voltage transistor shown in FIGS. 5 and 6 is substantially the same as the high voltage transistor shown in FIG. 1, except for an arrangement of the gate structure.

FIGS. 5 and 6, the first distance a1 between an edge of the gate structure 130 and the first barrier insulation patterns 116a and a second distance a2 between another edge of the gate structure 130 and the second barrier insulation patterns 116b may be different from each other.

For example, in an operation of the high voltage transistor, a distance between the barrier insulation pattern adjacent to an impurity region for supplying a high voltage and the edge of the gate structure may be greater than a distance between other barrier insulation pattern and another edge of the gate structure. For example, when the high voltage is supplied to the source region, the first distance a1 may be greater than the second distance a2. For example, when the high voltage is supplied to the drain region, the second distance a2 may be greater than the first distance a1. Thus, a breakdown voltage at the impurity region for supplying the high voltage may be raised.

Figure 7:
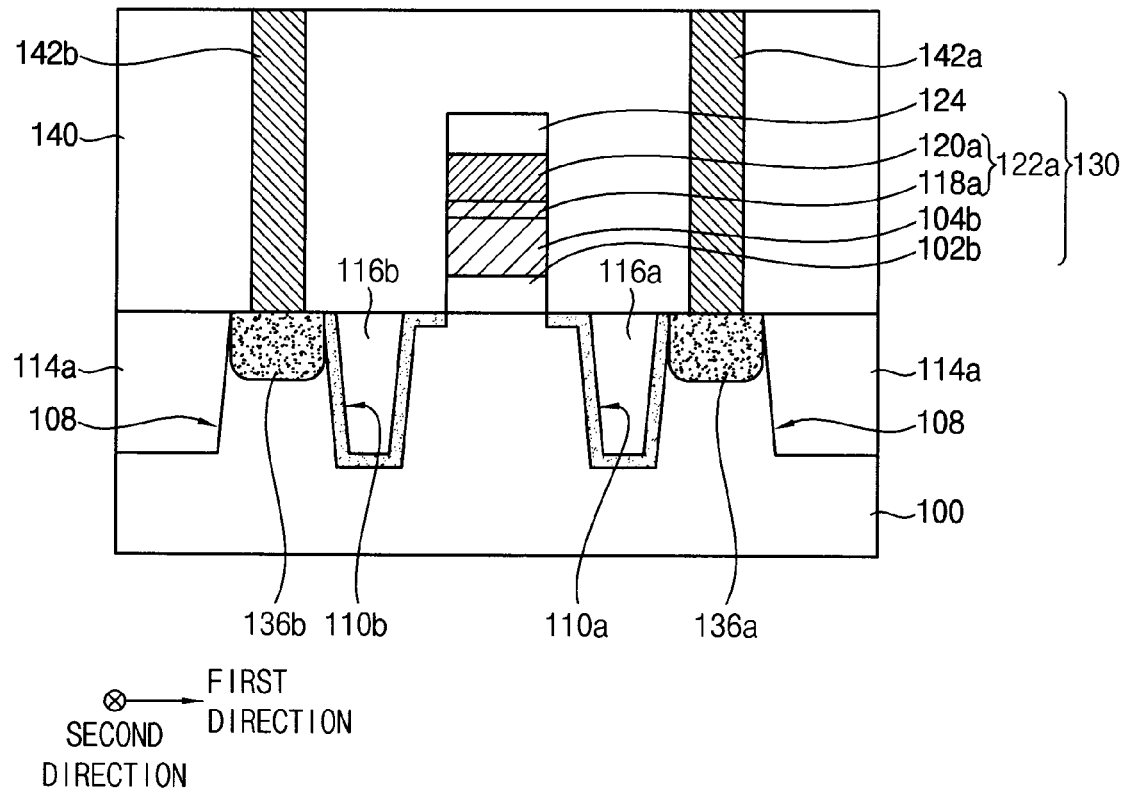
FIG. 7 is a cross-sectional view illustrating a high voltage transistor in accordance with exemplary embodiments of the present disclosure.
Figure 8:
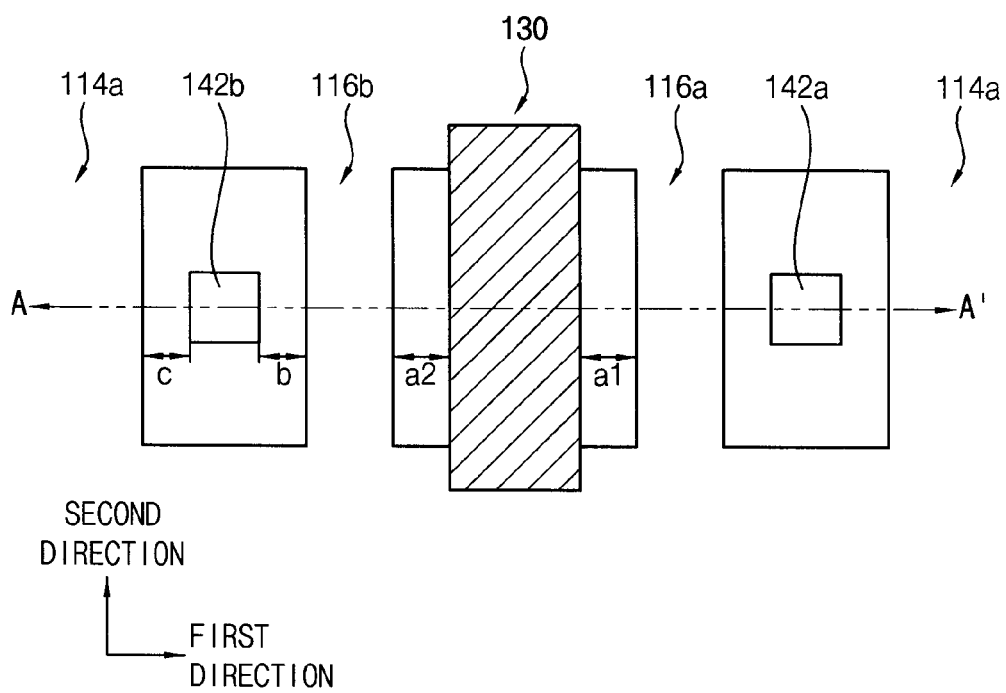
FIG. 8 is a plan view illustrating a high voltage transistor in accordance with exemplary embodiments of the present disclosure.

FIGS. 7 and 8 are a cross-sectional view and a plan view illustrating a high voltage transistor, respectively, in accordance with exemplary embodiments of the present disclosure. FIG. 7 is a cross-sectional view taken along the line A-A' of FIG. 8.

The high voltage transistor shown in FIGS. 7 and 8 may be substantially the same as the high voltage transistor shown in FIG. 1, except for an arrangement of the gate structure.

Referring to FIGS. 7 and 8, the first impurity regions 136a may be formed at an entire upper portion of the substrate 100 between the first barrier insulation patterns 116a and the isolation pattern 114a, and the third impurity regions 136b may be formed at the entire upper portion of the substrate 100 between the second barrier insulation patterns 116b and the isolation pattern 114a. For example, the first and third impurity regions 136a and 136b may contact the first and second barrier insulation patterns 116a and 116b, respectively.

The first and second contact plugs 142a and 142b may be formed at central portions of the first and third impurity regions 136a and 136b, respectively. In exemplary embodiments of the present disclosure, a distance between the first contact plug 142a and the first barrier insulation pattern 116a may be substantially the same as a distance between the first contact plug 142a and the isolation pattern 114a. Also, a distance b between the second contact plug 142b and the second barrier insulation pattern 116b may be substantially the same as a distance c between the second contact plug 142b and the isolation pattern 114a.

FIGS. 9 to 17 are cross-sectional views illustrating stages of a method of manufacturing a high voltage transistor in accordance with exemplary embodiments of the present disclosure.

Figure 9:
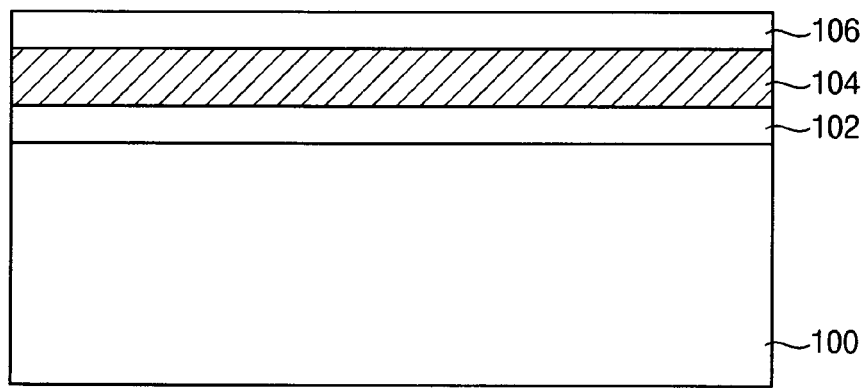
FIGS. 9 to 17 are cross-sectional views illustrating stages of a method of manufacturing a high voltage transistor in accordance with exemplary embodiments of the present disclosure.

Referring to FIG. 9, a gate insulation layer 102 may be formed on a substrate 100 including a memory cell region and a peripheral region. A first gate layer 104 may be formed on the gate insulation layer 102.

In exemplary embodiments of the present disclosure, the gate insulation layer 102 may include silicon oxide. In exemplary embodiments of the present disclosure, the first gate layer 104 may include polysilicon.

In some exemplary embodiments of the present disclosure, the gate insulation layer 102 may include a metal oxide having a high dielectric constant. In this case, the first gate layer 104 may include a metal.

A first mask layer 106 may be formed on the first gate layer 104. The first mask layer 106 may include silicon oxide or silicon nitride.

Figure 10:
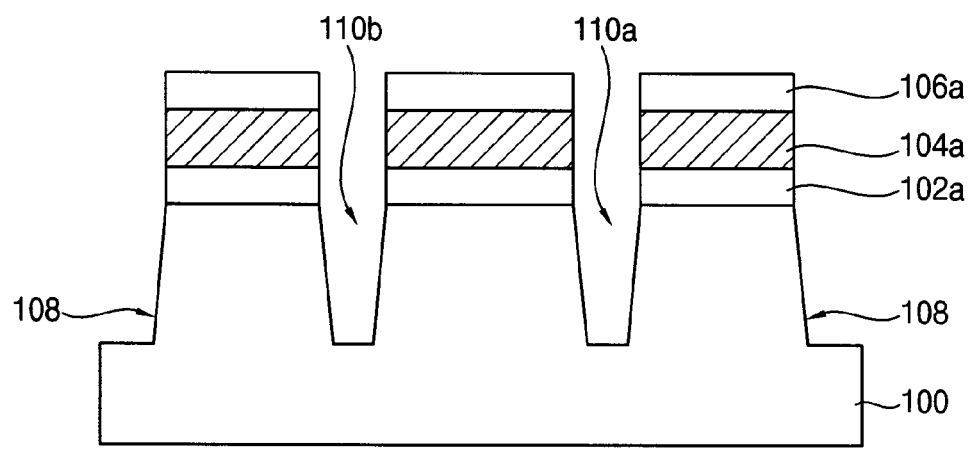

Referring to FIG. 10, the first mask layer 106 may be patterned to form a first mask pattern 106a. The first mask pattern 106a may include openings at regions where an isolation trench 108 and first and second trenches 110a and 110b may be subsequently formed.

The first gate layer 104, the gate insulation layer 102 and the substrate 100 may be etched using the first mask pattern 106a as an etching mask to form the isolation trench 108 and the first and second trenches 110a and 110b. Also, the first gate layer 104 and the gate insulation layer 102 may be patterned by the etching process. Thus, a preliminary first gate pattern 104a and a preliminary gate insulation pattern 102a may be formed.

A plurality of isolation trenches 108 may be formed within the substrate of the isolation regions. Thus, an active region may be defined by the isolation trenches 108. The first and second trenches 110a and 110b may be formed at the active region between the isolation trenches 108. An effective distance between a gate structure and a contact plug subsequently formed may be increased by forming the first and second trenches 110a and 110b.

Figure 11:
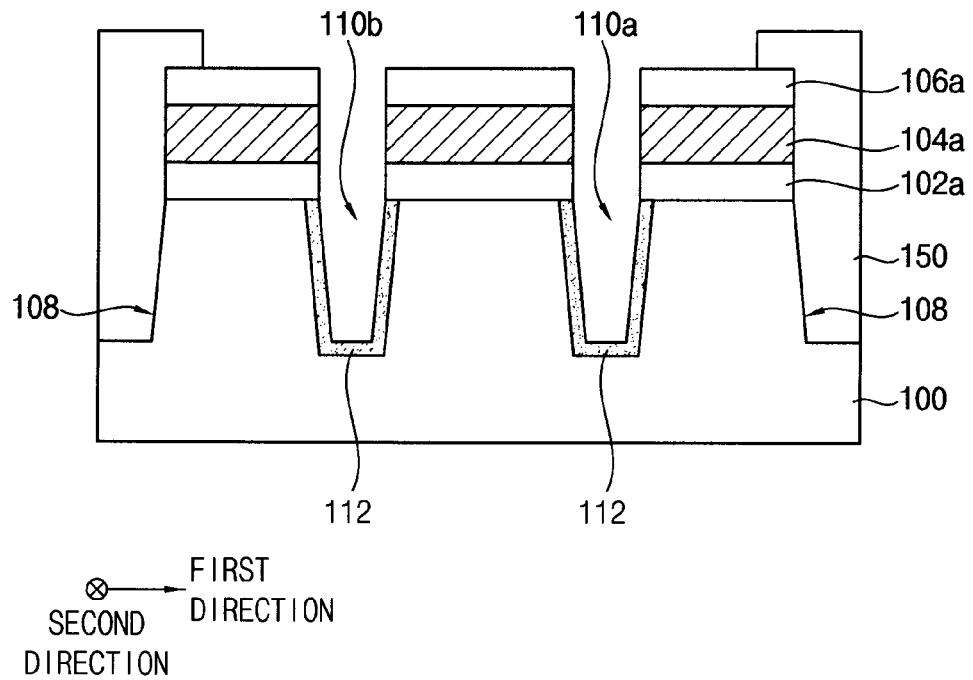

Referring to FIG. 11, a second mask pattern 150 may cover the isolation trenches 108 and the memory cell region and to expose the first and second trenches 110a and 110b. The second mask pattern 150 may be a photoresist pattern.

Impurities may be implanted (or doped) along surfaces of the first and second trenches 110a and 110b exposed by the second mask pattern 150 to form a preliminary first impurity region 112. The impurity implantation process may be performed by a tilt ion implantation process, so that the impurities lay be uniformly doped along the surfaces of the first and second trenches 110a and 110b.

Thereafter, the second mask pattern 150 may be removed.

Figure 12:
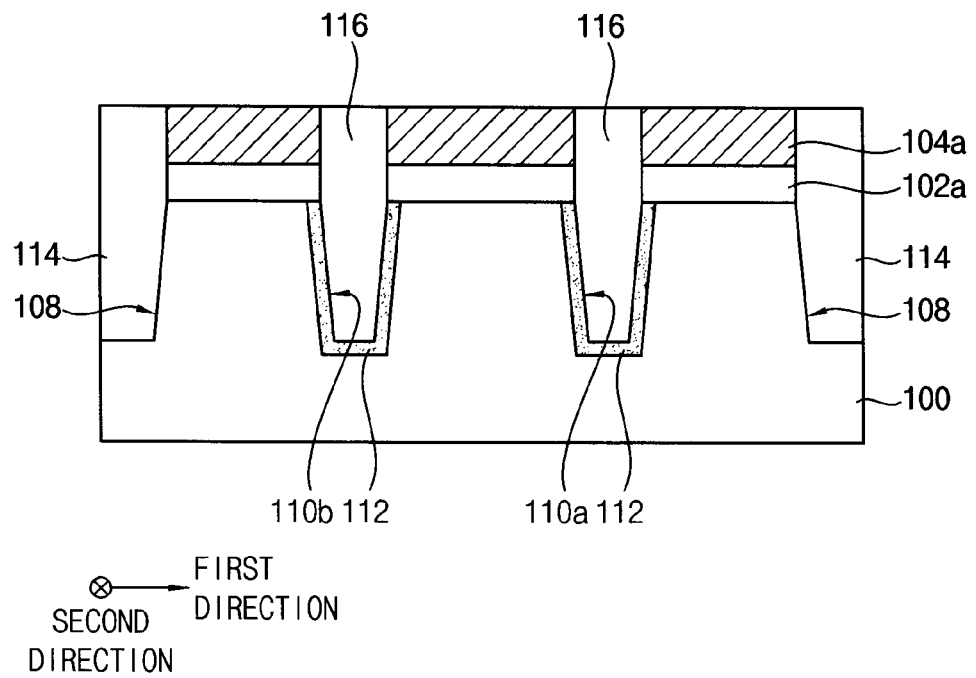

Referring to FIG. 12, an insulation layer may be formed on the first mask pattern 106a to fill the isolation trenches 108 and the first and second trenches 110a and 110b. A surface of the insulation layer may be planarized until an upper surface of the preliminary first gate pattern 104a may be exposed to form a first insulation pattern 114 and a second insulation pattern 116. The planarization process may include a chemical mechanical polishing (CMP) process and or an etch back process.

The first insulation pattern 114 may fill the isolation trenches 108 and a space between stacked structures including the preliminary gate insulation pattern 102a and the preliminary first gate pattern 104a thereover. Also, the second insulation pattern 116 may fill the first and second trenches 110a and 110b as well as a space between the stacked structures, including the preliminary gate insulation pattern 102a and the preliminary first gate pattern 104a thereover.

Figure 13:
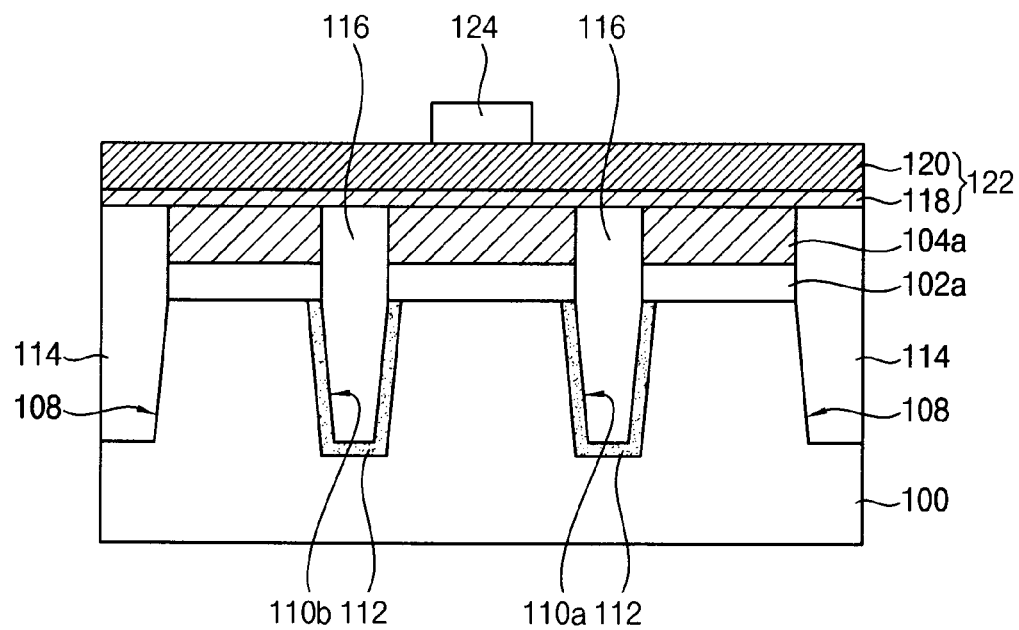

Referring to FIG. 13, a second gate layer 122 may be formed on the first and second insulation patterns 114 and 116 and the preliminary first gate pattern 104a.

In exemplary embodiments of the present disclosure, the second gate layer 122 may include a second polysilicon layer 118 and a metal suicide layer 120 that are stacked. Thereafter, a hard mask pattern 124 may be formed on the second gate layer 122.

The hard mask pattern 124 may serve as an etching mask for forming a gate structure. Thus, the hard mask pattern 124 may be formed on the active region between the first and second trenches 110a and 110b. Also, one end of the hard mask pattern 124 in the first direction may be spaced apart from the first trench 110a, and another end of the hard mask pattern 124 in the first direction may be spaced apart from the second trench 110b.

Figure 14:
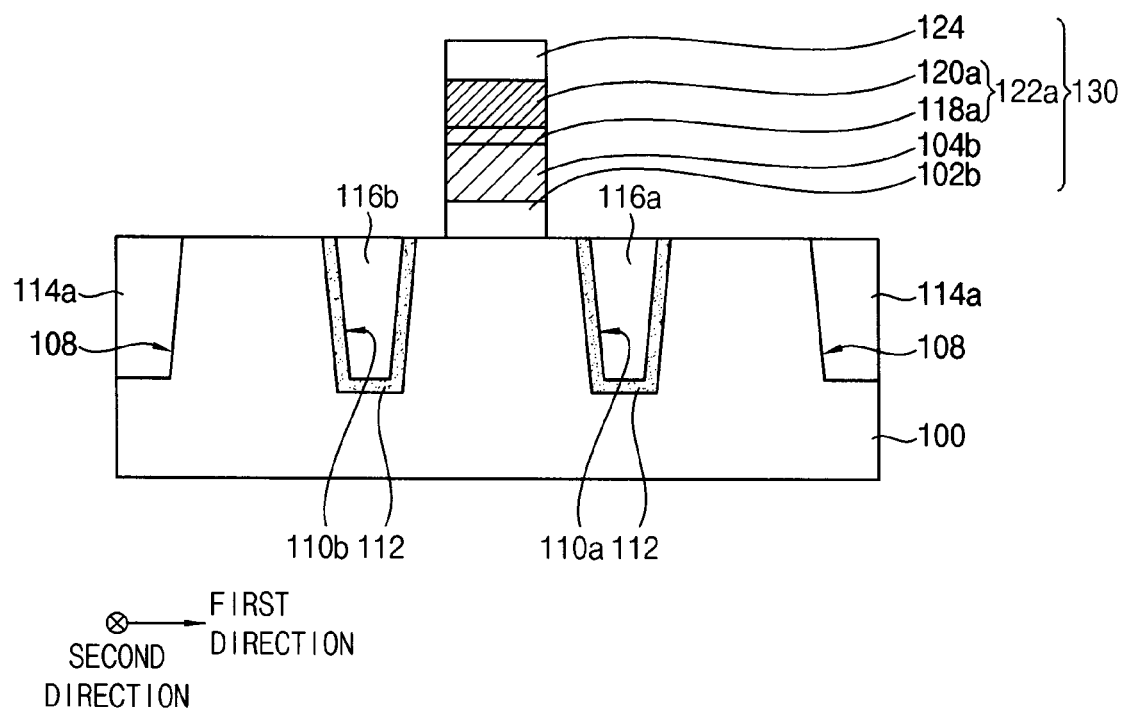

Referring to FIG. 14, the second gate layer 122, the preliminary first gate pattern 104a, the preliminary gate insulation pattern 102a and the first and second insulation patterns 114 and 116 may be etched using the hard mask pattern 124 as an etching mask to from the gate structure.

The gate structure 130 may be formed on the active region of the substrate 100, and the gate structure 130 may include a gate insulation pattern 102b, a first gate pattern 104b, a second gate pattern 122a and a hard mask pattern 124 that are stacked.

Also, an isolation pattern 114a may be formed in the isolation trench 108, and a first barrier insulation pattern 116a may be formed in the first trench 110a. A second barrier insulation pattern 116b may be formed in the second trench 110b. The first barrier insulation pattern 116a may be spaced apart from a first sidewall of the gate structure 130, and the second barrier insulation pattern 116b may be spaced apart from a second sidewall of the gate structure 130.

In exemplary embodiments of the present disclosure, in the patterning process of the gate structure 130, a distance between the gate structure 130 and the first barrier insulation pattern 116a and a distance between the gate structure 130 and the second barrier insulation pattern 116b may be substantially the same. In this case, the high voltage transistors shown in FIGS. 3 and 4 may be manufactured by performing subsequent processes.

In some exemplary embodiments of the present disclosure, in the patterning process of the gate structure 130, a distance between the gate structure 130 and the first barrier insulation pattern 116a and a distance between the gate structure 130 and the second barrier insulation pattern 116b may be different from each other. In this case, the high voltage transistors shown in FIGS. 5 and 6 may be manufactured by performing subsequent processes.

Figure 15:
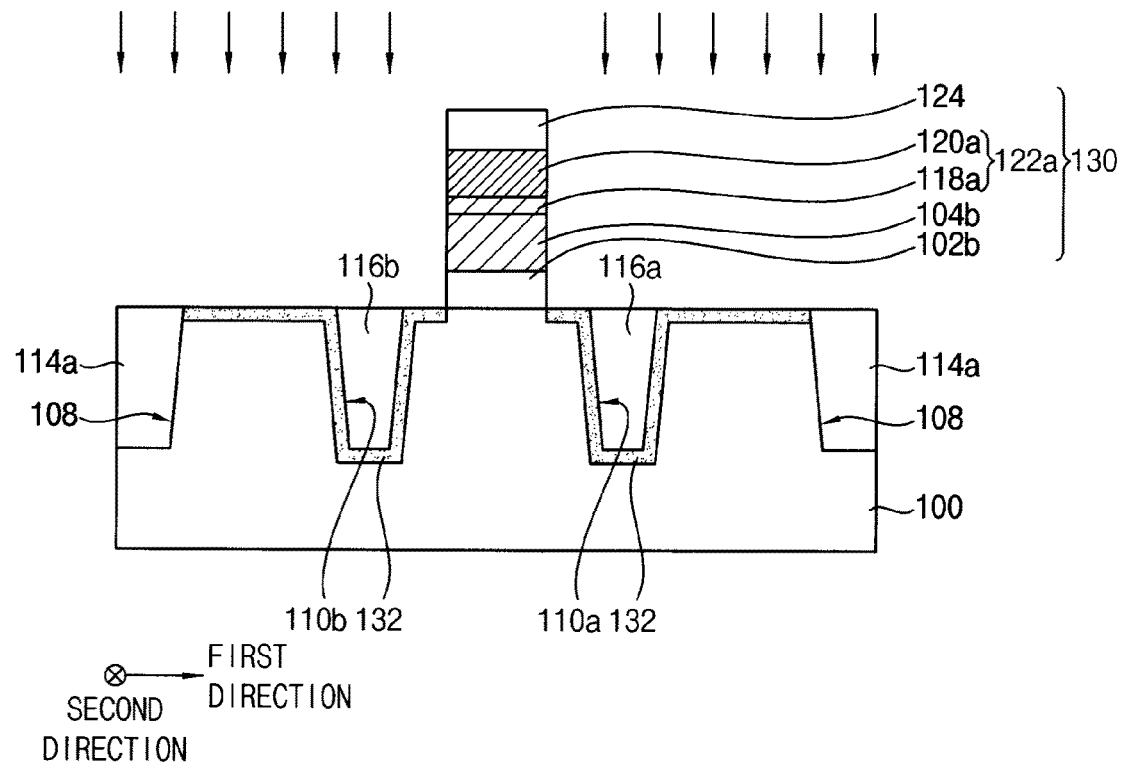

Referring to FIG. 15, an ion implantation process may be performed on the substrate 100 and the gate structure 130 to form a preliminary second impurity region 132. An upper portion of the substrate 100, in a region where the gate structure 130 is not formed, may be doped with impurities by the ion implantation process. Thus, the preliminary second impurity region 132 may be formed along the surfaces of the first and second trenches 110a and 110b and the surface of the substrate 100 between the gate structure 130 and the isolation pattern 114a.

In exemplary embodiments of the present disclosure, before doping of the impurities, a protect layer may be further formed on the surfaces of the substrate 100 and the gate structure 130. The protect layer may protect the gate structure 130 and the substrate 100 during the ion implantation process. The protect layer may include, e.g., silicon oxide.

The preliminary second impurity region 132 may serve as parts of the second and fourth impurity regions. The preliminary second impurity region 132 may have a first impurity concentration.

Figure 16:
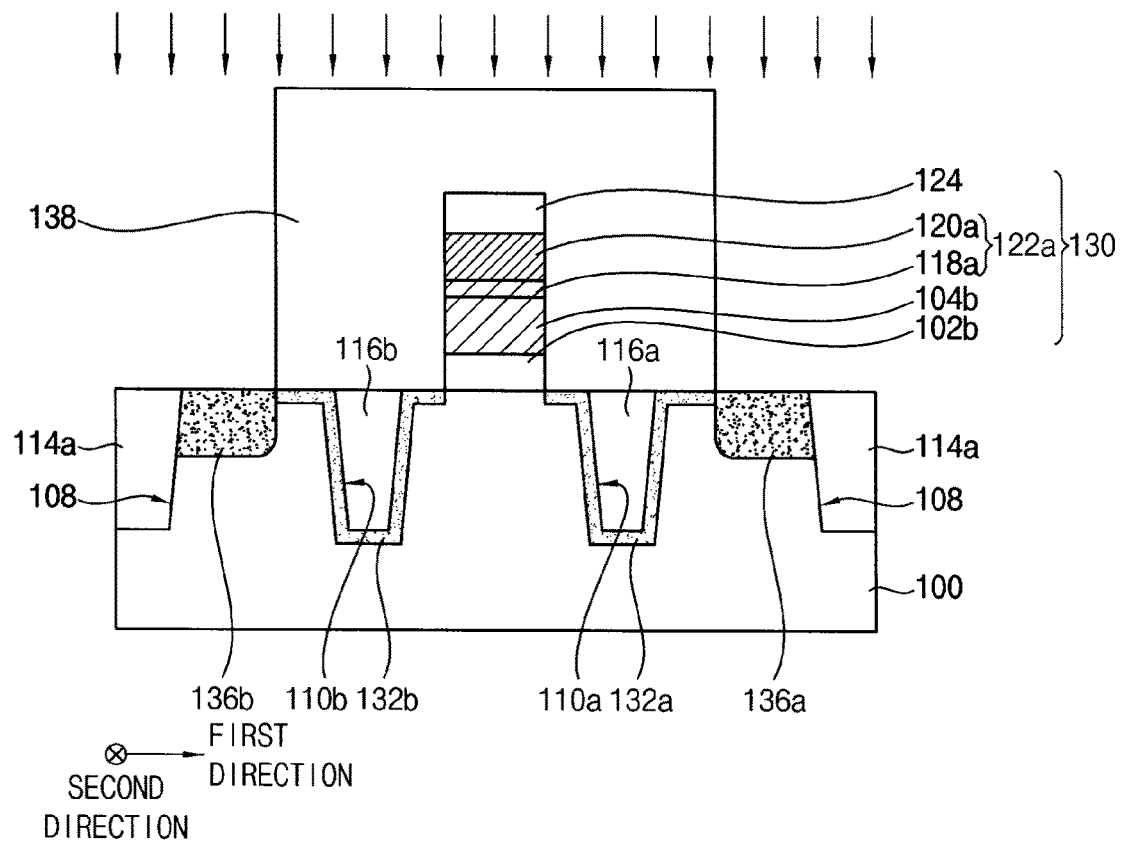

Referring to FIG. 16, a third mask pattern 138 may be formed on the substrate 100 and the gate structure 130. The third mask pattern 138 may be used as an ion implantation mask in a doping process for forming the first and third impurity regions 136a and 136b.

In exemplary embodiments of the present disclosure, the third mask pattern 138 may selectively expose a portion of the substrate 100 for forming the first contact plug.

Impurities may be implanted on the surface of the substrate 100 using the third mask pattern 138 as a mask to form the first and third impurity regions 136a and 136b. The preliminary second impurity region 132 connected to the first impurity region 136a may serve as a second impurity region 132a. Also, the preliminary second impurity region 132 connected to the third impurity region 136 may serve as a fourth impurity region 132b.

Impurities doped in the first to fourth impurity regions 136a, 132a, 136b, and 132b may have the same conductivity type. In exemplary embodiments of the present disclosure, a second impurity concentration of the first and third impurity regions 136a and 136b and a first impurity concentration of the second and fourth impurity regions 132a and 132b may be different from each other. For example, the second impurity concentration may be higher than the first impurity concentration.

In exemplary embodiments of the present disclosure, the first impurity region 136a may be spaced apart from the first barrier insulation pattern 116a. In exemplary embodiments of the present disclosure, the third impurity region 136b may be spaced apart from the second barrier insulation pattern 116b.

In some exemplary embodiments of the present disclosure, the first impurity region 136a may be formed between an entire upper portion of the substrate between the first barrier insulation pattern 116a and the isolation pattern 114a. The third impurity region 136a may be formed between the upper entire portion of the substrate between the second barrier insulation pattern 116b and the isolation pattern 114a. In this case, the high voltage transistors shown in FIGS. 7 and 8 may be manufactured by performing subsequent processes.

Then, the third mask pattern 138 may be removed.

Figure 17:
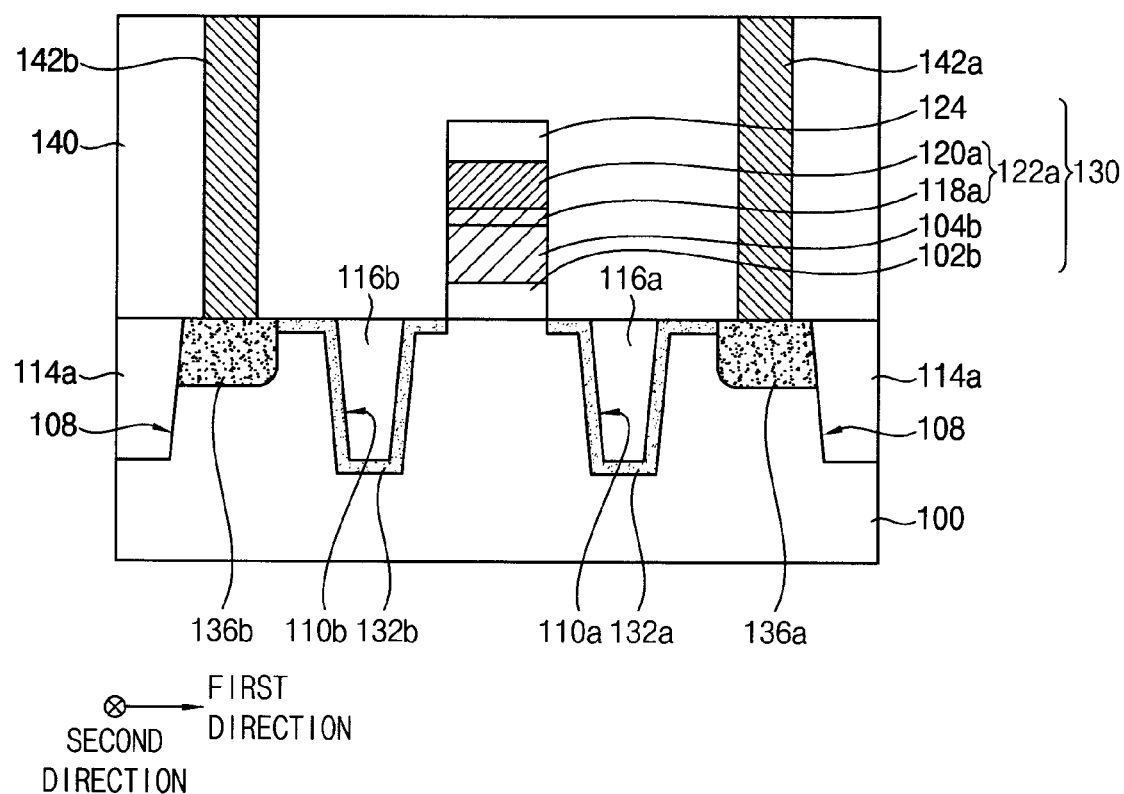

Referring to FIG. 17, an insulating interlayer 140 may cover the substrate 100 and the gate structure 130. First and second contact plugs 142a and 142b may be formed through the insulating interlayer 140.

The first and second contact plugs 142a and 142b may contact upper surfaces of the first and third impurity regions 136a and 136b, respectively.

In exemplary embodiments of the present disclosure, a gate contact plug may be further formed through the insulating interlayer 140 and the hard mask pattern 124. The gate contact plug may contact an upper surface of the second gate pattern 122a.

In exemplary embodiments of the present disclosure, a distance between the first contact plug 142a and the first barmier insulation patterns 116a may be greater than a distance between the first contact plug 142a and the isolation pattern 114a. Also, a distance between the second contact plug 142b and the second barrier insulation patterns 116b may be greater than a distance between the second contact plug 142b and the isolation pattern 114a.

In some exemplary embodiments of the present disclosure, as shown in FIGS. 7 and 8, a distance between the first contact plug 142a and the first barrier insulation patterns 116a may be substantially the same as a distance between the first contact plug 142a and the isolation pattern 114a. Also, a distance between the second contact plug 142b and the second barrier insulation patterns 116b may be substantially the same as a distance between the second contact plug 142b and the isolation pattern 114a.

Figure 18:
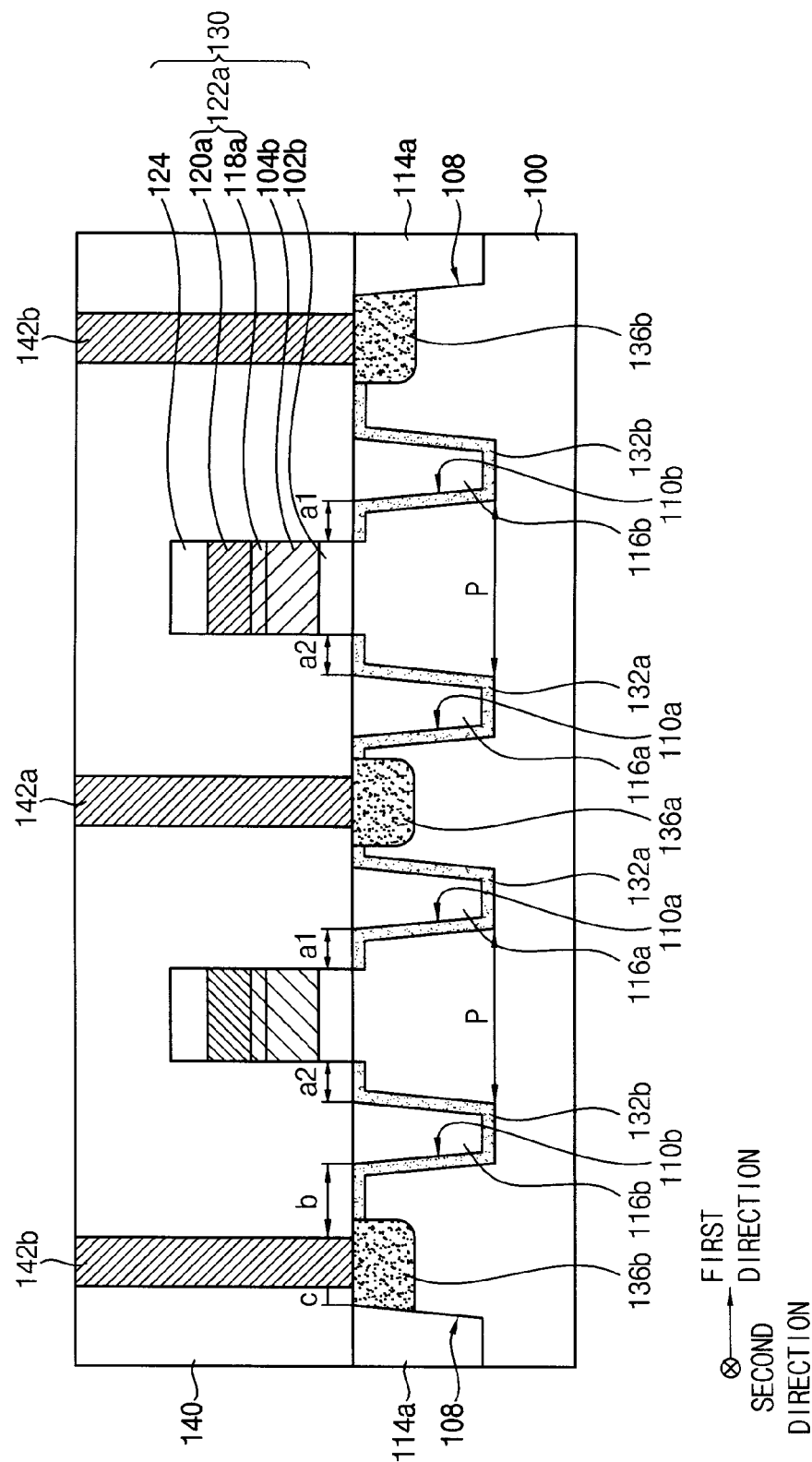
FIG. 18 is a cross-sectional view illustrating a high voltage transistor in accordance with exemplary embodiments of the present disclosure.
Figure 19:
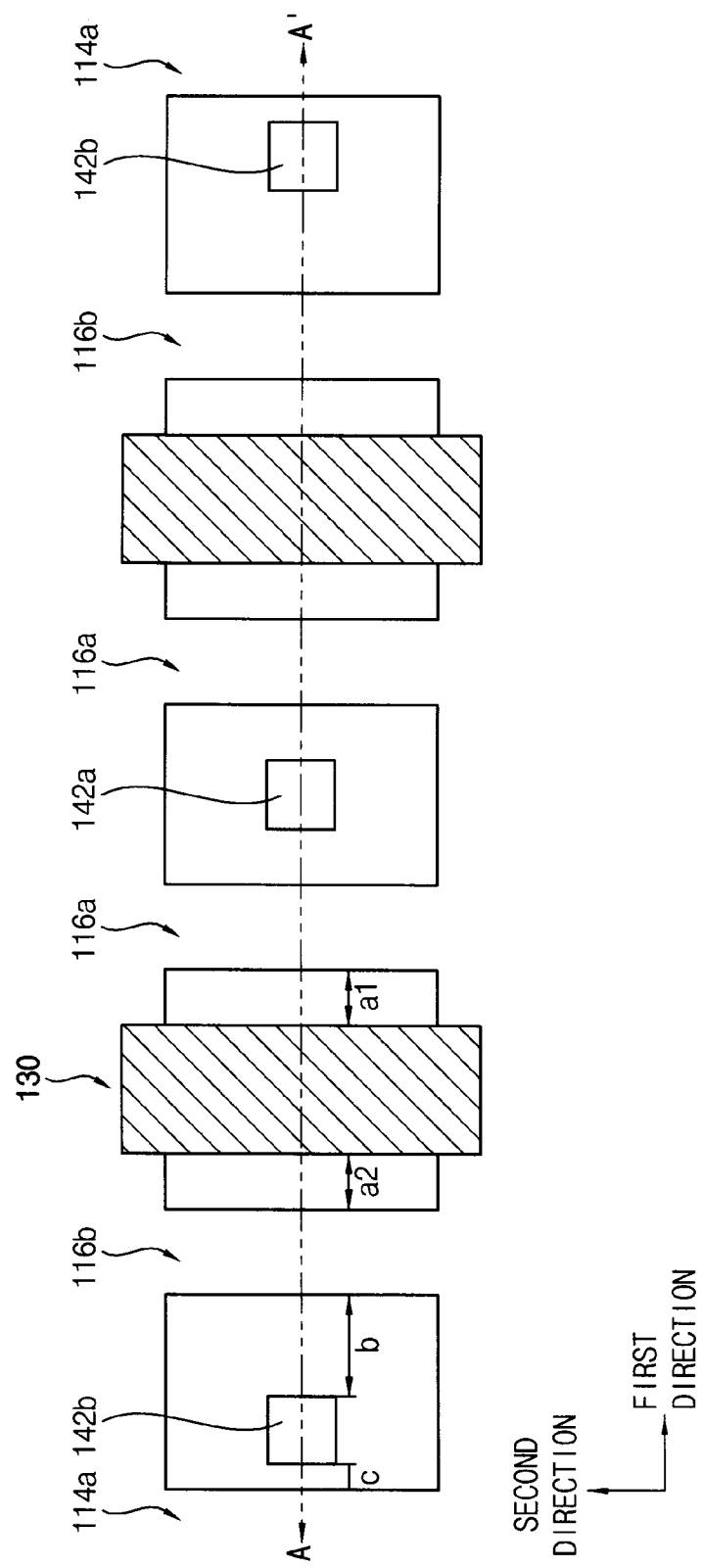
FIG. 19 is a plan view illustrating a high voltage transistor in accordance with exemplary embodiments of the present disclosure, respectively.

FIGS. 18 and 19 are a cross-sectional view, and a plan view illustrating a high voltage transistor in accordance with exemplary embodiments of the present disclosure, respectively, FIG. 19 is a cross-sectional view taken along the line A-A' of FIG. 18.

FIGS. 18 and 19 may have a plurality of high voltage transistors that are electrically connected to each and formed in an active region. A structure of each of the high voltage transistors may be substantially the same a structure as described with reference to FIG. 1.

FIGS. 18 and 19, a plurality of gate structures 130 extending in the second direction may be formed on the substrate 100. The plurality of gate structures 130 may be spaced apart from each other in the first direction.

The first and second trenches 110a and 110b may be formed between the plurality of gate structures 130 and between one of the gate structures 130 and the isolation pattern 114a, respectively. In exemplary embodiments of the present disclosure, the first trench 110a may be spaced apart from the first sidewall of one of gate structures 130, and the second trench 110b may be spaced apart from the second sidewall of the one of the gate structures 130. First and second barrier insulation patterns 116a and 116b may be formed in the first and second trenches 110a and 110b, respectively.

In exemplary embodiments of the present disclosure, the first impurity region 136a may serve as a common impurities region of two high volume transistors being connected each other in the first direction. In exemplary embodiments of the present disclosure, the two high voltage transistors may be symmetric with respect to a straight line in a second direction passing the first impurity region 136a. In this case, the first impurity region 136a may be disposed between the first barrier insulation patterns 116a in the two high voltage transistors.

In exemplary embodiments of the present disclosure, the third impurity region 136b may be formed between the second barrier insulation pattern 116b and the isolation pattern 114a.

The first contact plugs 142a may be formed on an upper surface of the first impurity region 136a. The second contact plugs 142b may be formed on an upper surface of the third impurity region 136b.

Figure 20:
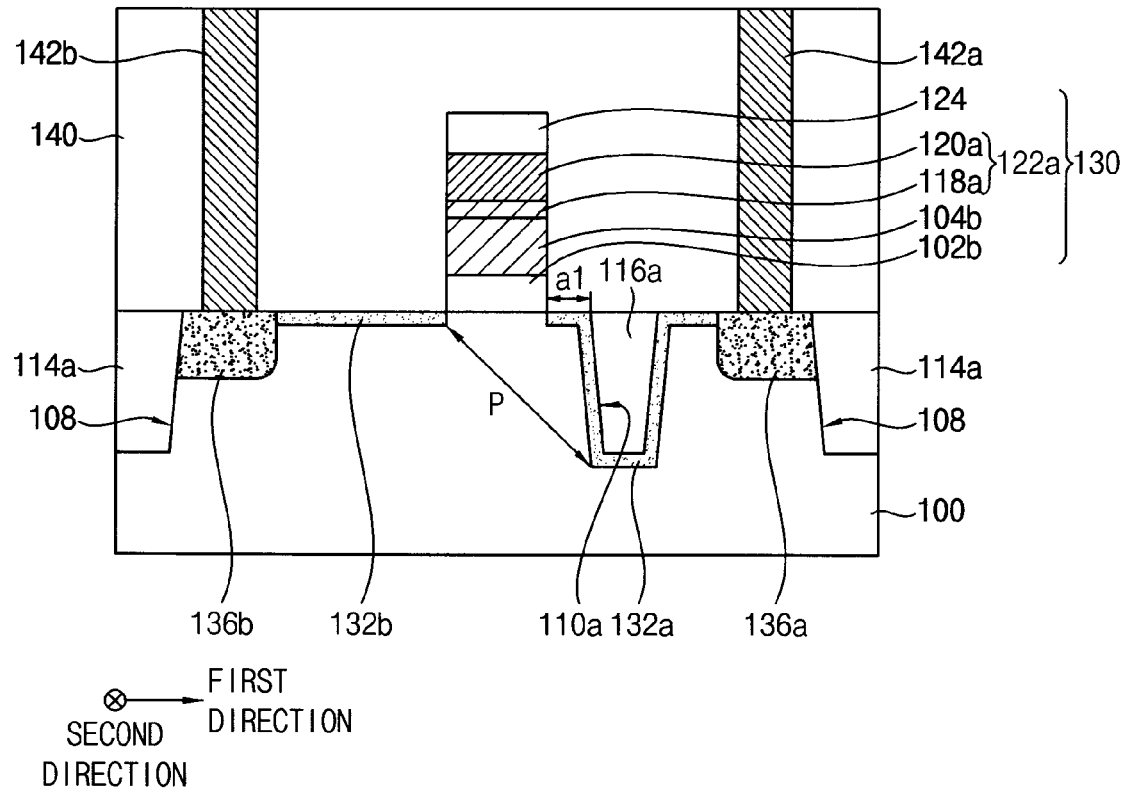
FIG. 20 is a cross-sectional view illustrating a high voltage transistor in accordance with exemplary embodiments of the present disclosure.
Figure 21:
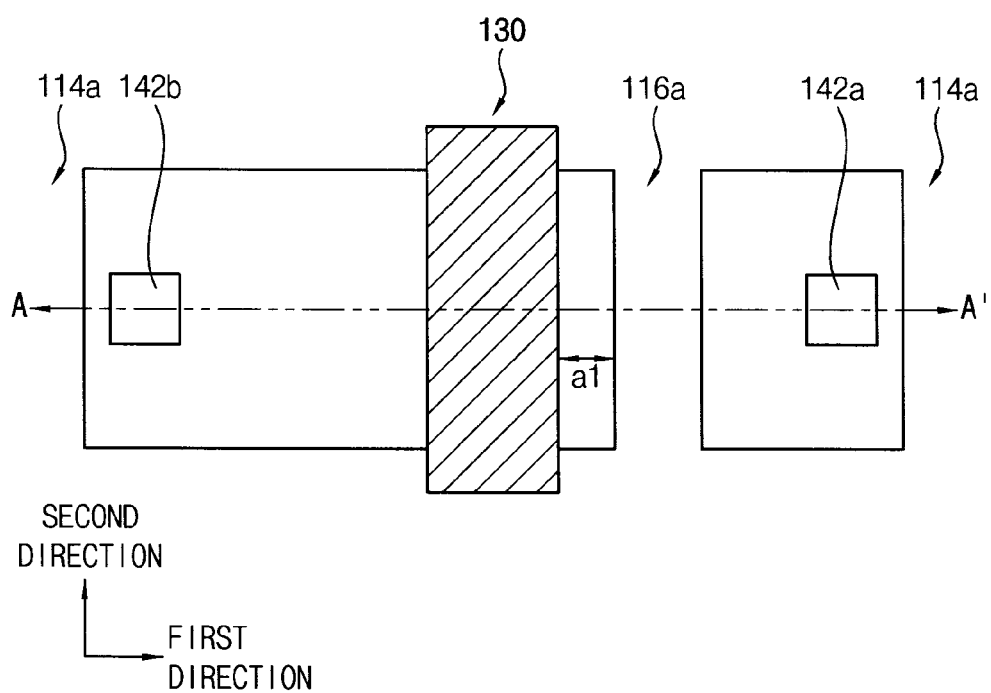
FIG. 21 is a plan view illustrating a high voltage transistor in accordance with exemplary embodiments of the present disclosure, respectively.
Figure 22:
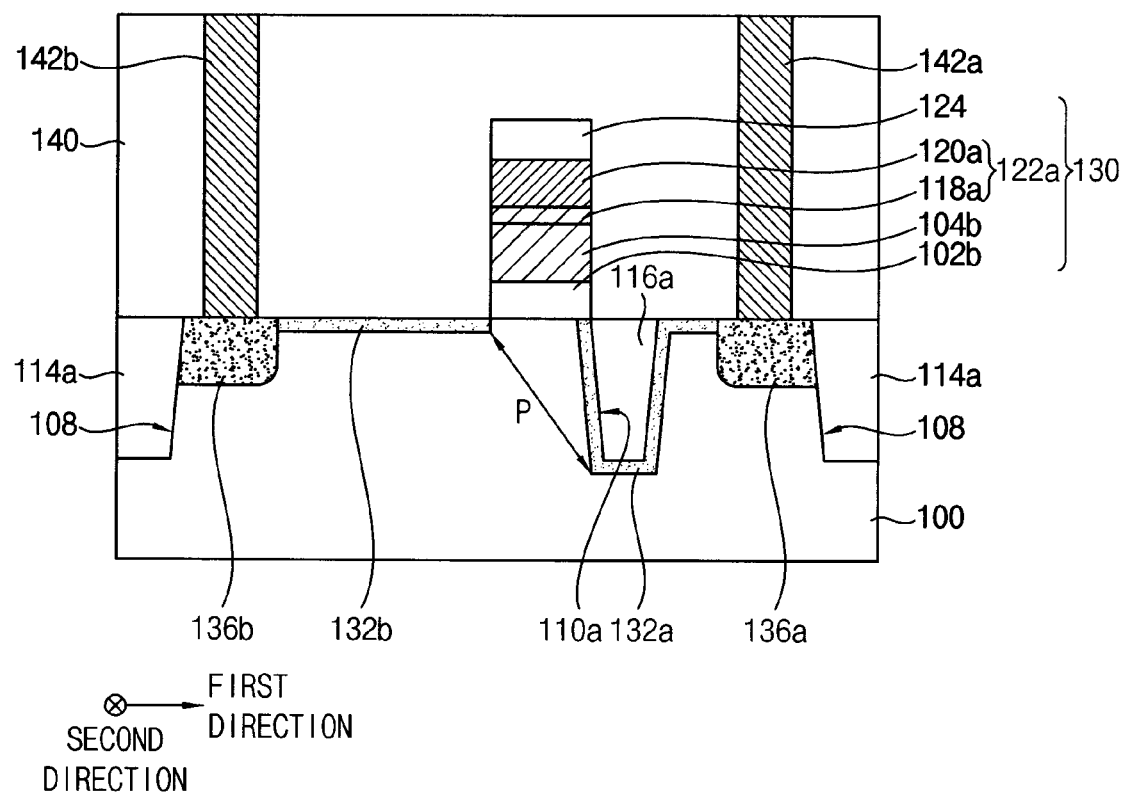
FIG. 22 is a cross-sectional view illustrating a high voltage transistor in accordance with exemplary embodiments of the present disclosure.

FIGS. 20 and 21 are a cross-sectional view and a plan view illustrating a high voltage transistor in accordance with exemplary embodiments of the present disclosure, respectively. FIG. 22 is a cross-sectional view illustrating a high voltage transistor in accordance with exemplary embodiments of the present disclosure. FIG. 20 is a cross-sectional view taken along the line A-A' of FIG. 21.

Each of the high voltage transistors is substantially the same as the high voltage transistor shown in FIG. 1, except for barrier insulation patterns.

Referring to FIGS. 20 and 21, the high voltage transistor may include the gate structure 130, the first barrier insulation pattern 116a and the impurity regions 136a, 132a, 136b, and 132b. The insulating interlayer 140 may cover the high voltage transistor. The first and second contact plugs 142a and 142b may be formed through the insulating interlayer 140. The first and second contact plugs 142a and 142b may contact at least a portion of the impurity regions.

The substrate 100 may include the first trend 110 to be spaced apart from the first sidewall of the gate structure 130 in the first direction. The first barrier insulation pattern 116a may be formed in the first trench 110.

For example, the first barrier insulation pattern 116a may be spaced apart from one sidewall of the gate structure 130 in the first direction. The second barrier insulation pattern might not be formed on the substrate 100. Particularly, the second barrier insulating pattern being spaced apart from the second sidewall facing the first sidewall of the gate structure 130 might not be formed. Thus, the first barrier insulation pattern 116a may be asymmetrical with respect to the gate structure 130.

The impurity regions may include the first impurity region 136a, the second impurity region 132a, the third impurity region 136b, and the fourth impurity region 132b.

The first impurity region 136a may be formed under a surface of the substrate 100 in the active region between the first barrier insulation pattern 116a and the isolation pattern 114a. The second impurity region 132a may be formed within the substrate 100 along the surface of the first trench 110 in which the first barrier insulation pattern 116a is formed. The first and second impurity regions 136a and 132a may be connected to each other.

The third impurity region 136b may be spaced apart from the second sidewall of the gate structure 130. The third impurity region 136b may be formed under the surface of the substrate 100 in the active region between the second sidewall of the gate structure 130 and the isolation pattern 114a. The fourth impurity region 132b may be formed under the surface of the substrate 100 of the active region between the second sidewall of the gate structure 130 and the third impurity region 136b. The third and fourth impurity regions 136b and 132b may be formed under a flat top surface of the substrate 100.

As the first barrier insulation pattern 116a may be spaced apart from the first sidewall of the gate structure 130, the second impurity region 132a under a bottom of the first barrier insulation pattern 116a and the fourth impurities region 132b might not be positioned on the same plane. The bottom of the first barrier insulation pattern 116a and a portion of the substrate 100 adjacent to the second sidewall of the gate structure 130 may be disposed in an oblique direction. Thus, the distance p between the bottom of the first barrier insulation pattern 116a and the portion of the substrate 100 adjacent to the second sidewall of the gate structure 130 may be increased. Also, a lowermost portion of the second impurity region 132a and the fourth impurity region 132b may be disposed in an oblique direction, so that a distance between the lowermost portion of the second impurity region 132a and the fourth impurity region 132b may increase. For example, an unwanted channel pass generated between the second impurity region 132a under the bottom of the first barrier insulation pattern 116a and the fourth impurity region 132b adjacent to the second sidewall of the gate structure may decrease. Thus, the punch-through may decrease.

As the first barrier insulation pattern 116a is asymmetrically disposed with respect to the gate structure 130, the punch-through may be considerably decreased. Therefore, in some exemplary embodiments of the present disclosure, as shown in FIG. 22, the first sidewall of the gate structure 130 and the first barrier insulation pattern 116a might not be spaced apart from each other.

In exemplary embodiments of the present disclosure, the first barrier insulation pattern 116a may be disposed adjacent to an impurity region for supplying the high voltage during the operation of the high voltage transistor.

The first contact plug 142a may contact the first impurity region 136a. The second contact plug 142b may contact the third impurity region 136b.

In exemplary embodiments of the present disclosure, a distance between the first contact plug 142a and the first barrier insulation pattern 116a may be greater than a distance between the first contact plug 142a and the isolation pattern 114a.

In exemplary embodiments of the present disclosure, a distance between the second contact plug 142b and the gate structure 130 may be greater than a distance between the second contact plug 142b and the isolation pattern 114a.

As a distance p between a bottom of the first barrier insulation pattern 116a and the fourth impurity region 132b is increased, the punch-through of the high voltage transistor may decrease.

FIGS. 23 to 27 are cross-sectional views illustrating a method of manufacturing a high voltage transistor in accordance with exemplary embodiments of the present disclosure.

Figure 23:
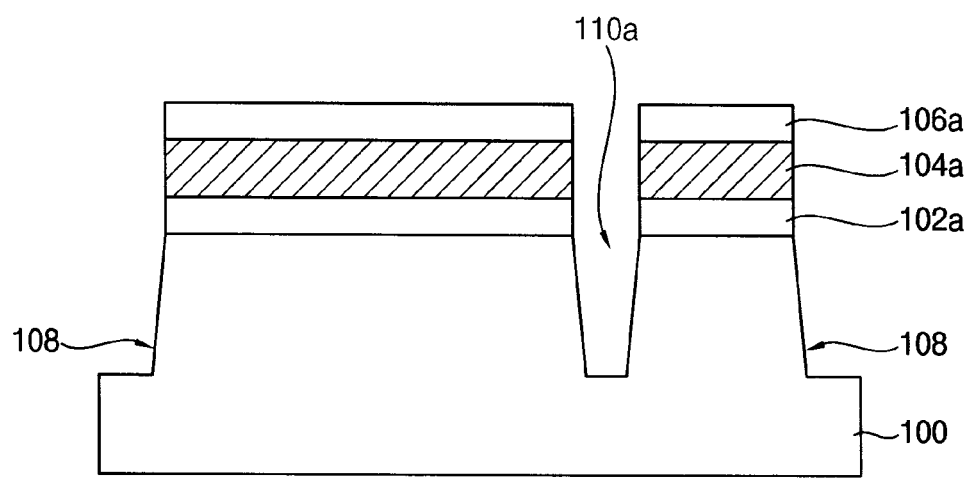
FIGS. 23 to 27 are cross-sectional views illustrating a method of manufacturing a high voltage transistor in accordance with exemplary embodiments of the present disclosure.

Referring to FIG. 23, a gate insulation layer, a first gate layer, and a first mask layer may be formed on the substrate 100 including the memory cell region and the peripheral region.

The first mask layer may be patterned to form the first mask pattern 106a. The first gate layer, the gate insulation layer, and the substrate 100 may be etched using the first mask pattern 106a as an etch mask to form the isolation trenches 108 and the first trench 110a. Also, the first gate layer and the gate insulation layer may be patterned by the etching process, so that the preliminary first gate pattern 104a and the preliminary gate insulation pattern 102a may be formed.

The isolation trenches 108 may be formed in an isolation region of the substrate 100. The first trench 110a may be spaced apart from the first sidewall of the gate structure subsequently formed.

Figure 24:
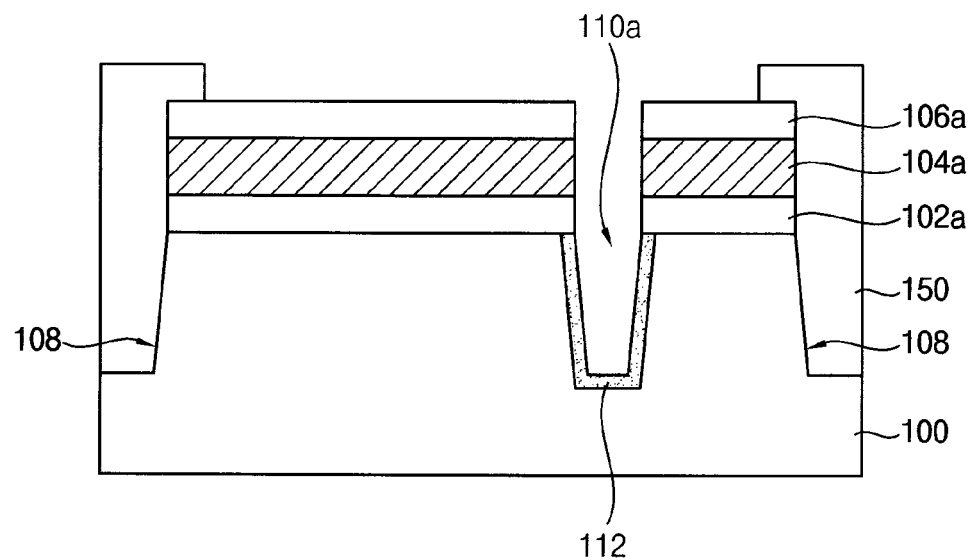

Referring to FIG. 24, a second mask pattern 150 may cover the isolation trenches 108 and the memory cell region and to expose the first trench 110a. Impurities may be implanted (or doped) along a surface of the first trench 110a exposed by the second mask pattern 150 to form the preliminary first impurity region 112. Then, the second mask pattern 150 may be removed.

Figure 25:
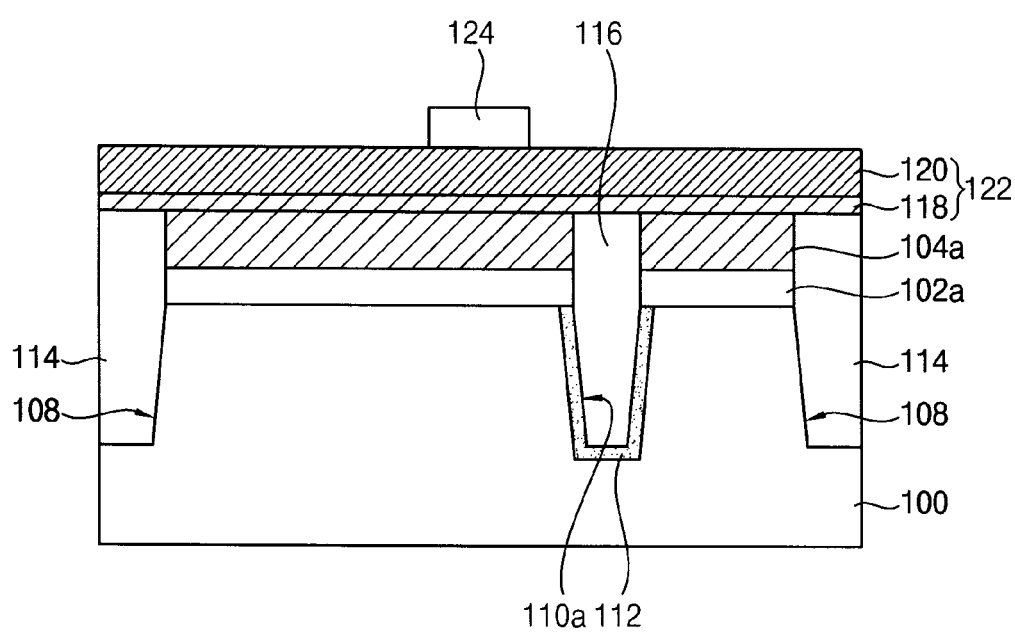

Referring to FIG. 25, the same processes as described with reference to FIGS. 12 to 14 may be performed.

Thus, the first insulation pattern 114 may fill the isolation trench 108 and a space between stacked structures including the preliminary gate insulation pattern 102a and the preliminary first gate pattern 104a thereover. Also, the second insulation pattern 116 may fill the first trench 110a and a space between stacked structures including the preliminary gate insulation pattern 102a and the preliminary first gate pattern 104a thereover.

The second gate layer 122 and the hard mask pattern 124 may be formed on the first and second insulation patterns 114 and 116 and the preliminary first gate pattern 104a. The first sidewall of the hard mask pattern 124 and the first trench 110a may be spaced apart from each other in the first direction.

Figure 26:
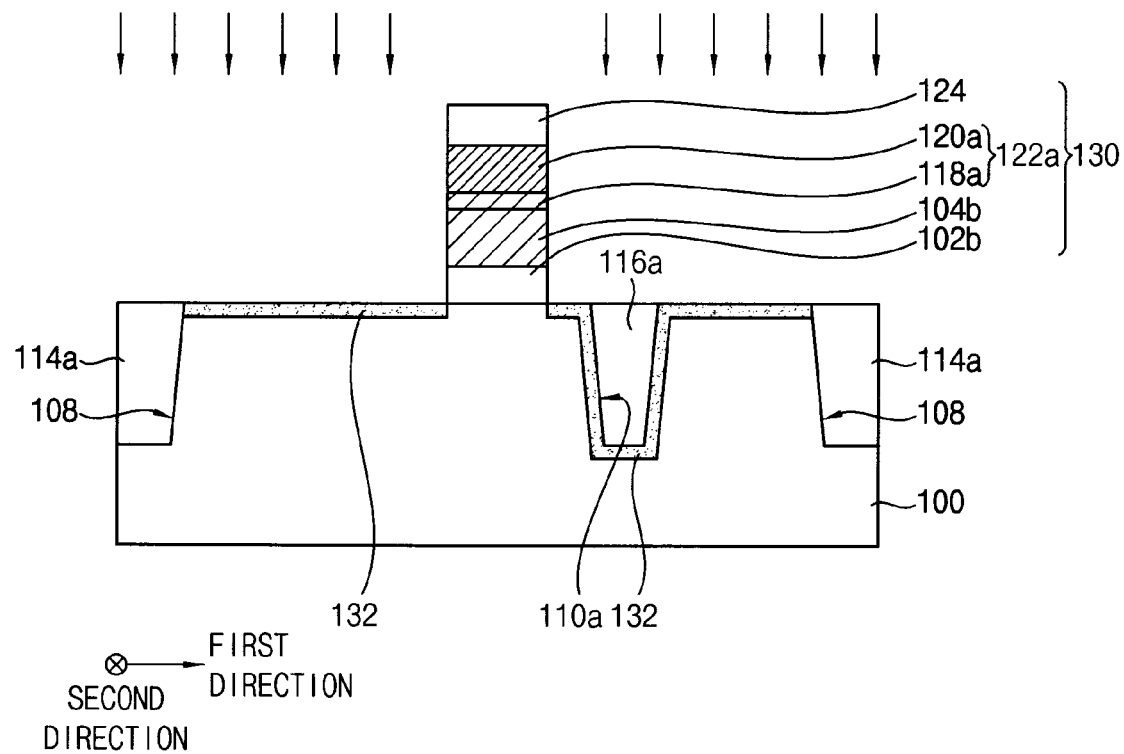

Referring to FIG. 26, the second gate layer 122, the preliminary first gate pattern 104a, the preliminary gate insulation pattern 102a and the first and second insulation patterns 114 and 116 may be etched using the hard mask pattern 124 as an etching mask to form the gate structure 130.

Thus, the gate structure 130 may be thrilled on the substrate 100 in the active region. Also, the isolation pattern 114a may be formed in each of the isolation trenches 108, and the first barrier insulation pattern 116a may be formed in the first trench 110a.

An ion implantation process may be performed on the substrate 100 and the gate structure 130 to form a preliminary second impurity region 132. The preliminary second impurity region 132 may be formed along a surface of the first trench 110a and a surface of the substrate 100 between the gate structure 130 and the isolation pattern 114a.

Figure 27:
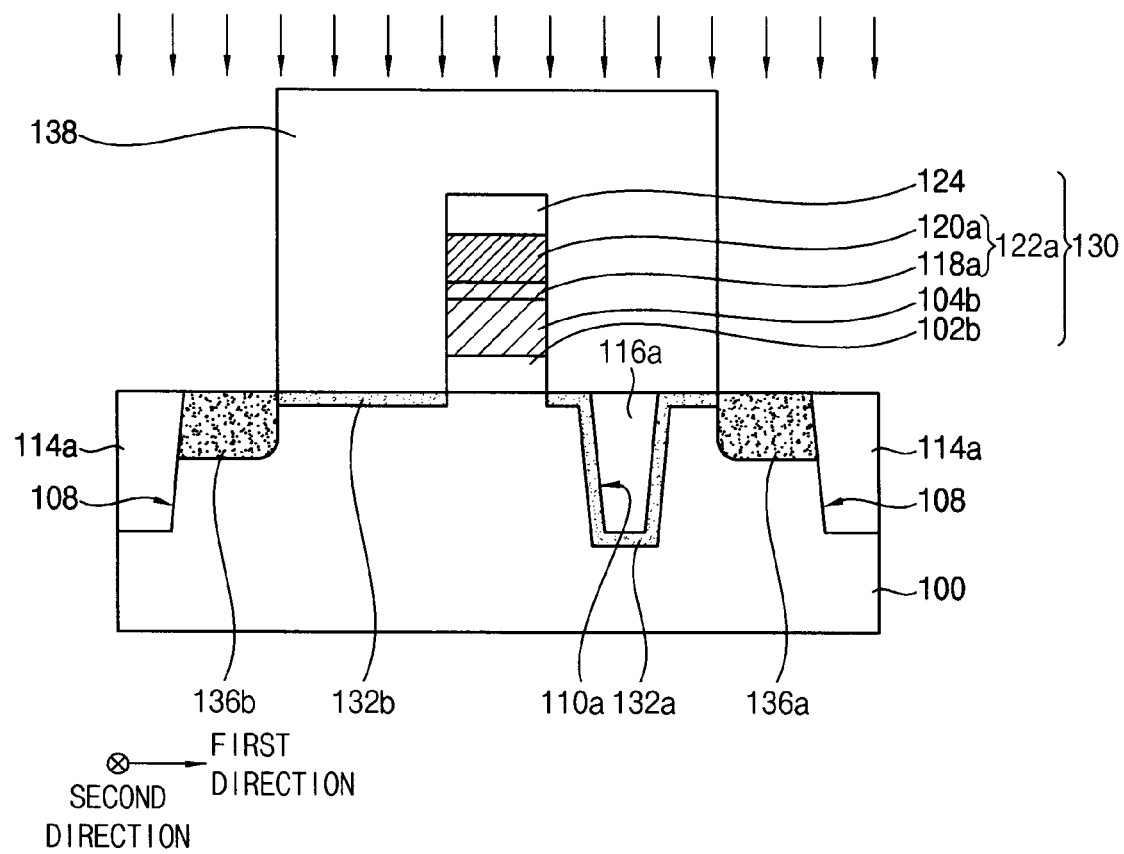

Referring to FIG. 27, the third mask pattern 138 may be formed on the substrate 100 and the gate structure 130. The third mask pattern 138 may serve as an ion implantation mask in a doping process for forming the first and third impurity regions 136a and 136b.

Impurities may be implanted on the surface of the substrate 100 using the third mask pattern 138 to form first and third impurity regions 136a and 136b. The preliminary second impurity region 132 connected to the first impurity region 136a may serve as the second impurity region 132a. Also, the preliminary second impurity region 132 connected to the third impurity region 136b may serve as the fourth impurity region 132b.

Referring again to FIG. 22, the insulating interlayer 140 may cover the substrate 100 and the gate structure 130. Then, the first and second contact plugs 142a and 142b may be formed through the insulating interlayer 140.

Figure 28:
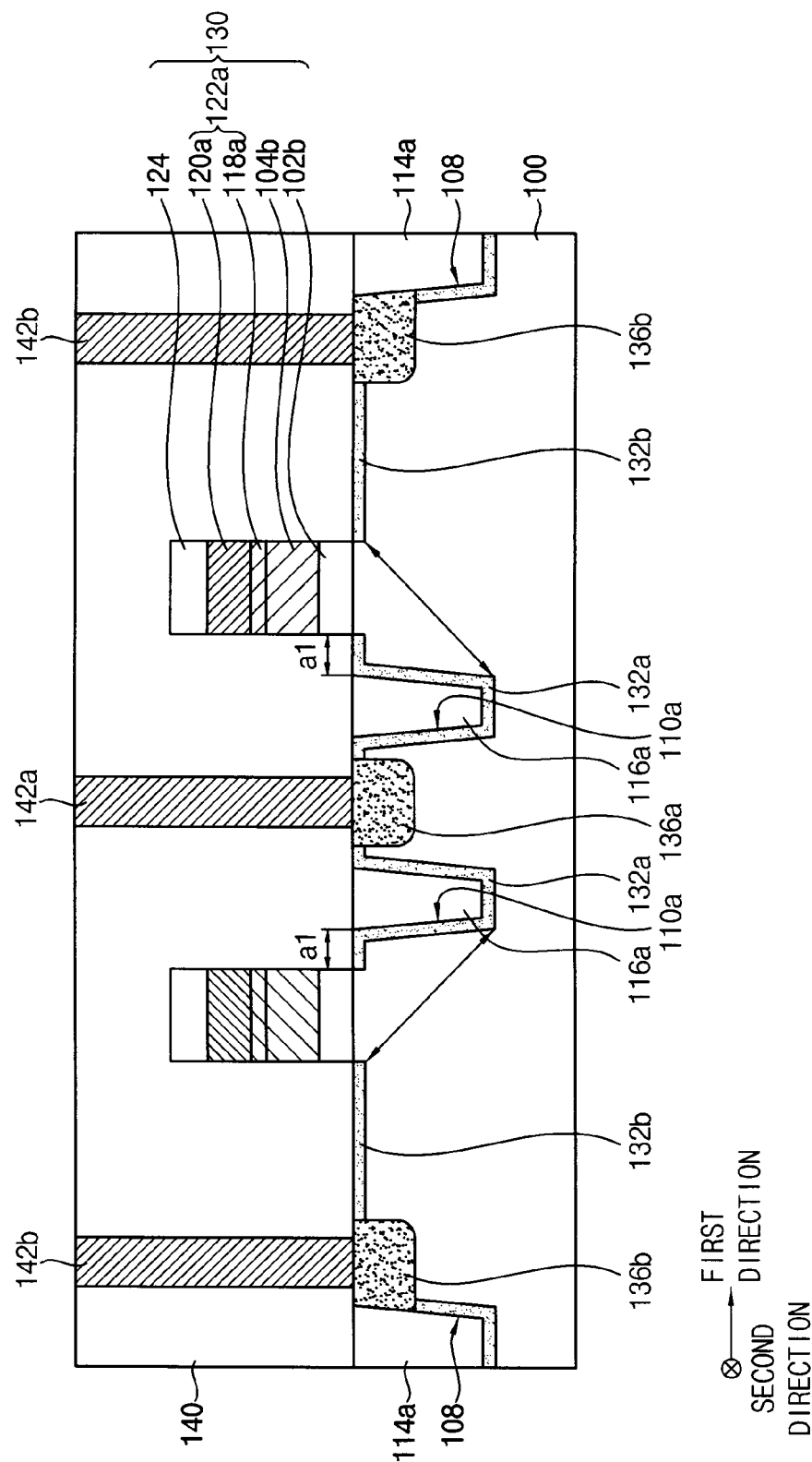
FIG. 28 is a cross-sectional view illustrating a high voltage transistor in accordance with exemplary embodiments of the present disclosure.
Figure 29:
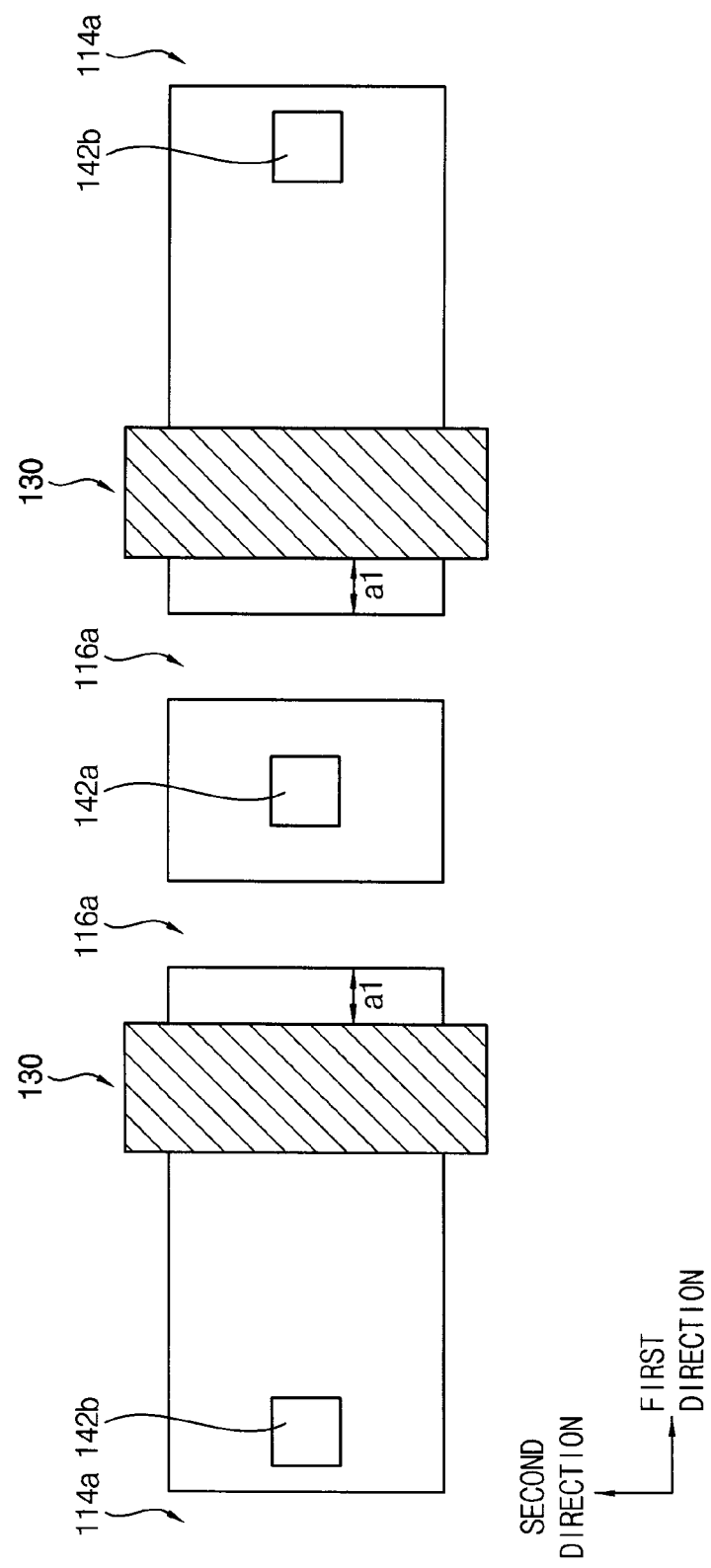
FIG. 29 is a plan view illustrating a high voltage transistor in accordance with exemplary embodiments of the present disclosure.

FIGS. 28 and 29 are a cross-sectional view and a plan views, respectively, illustrating a high voltage transistor in accordance with exemplary embodiments of the present disclosure.

In the FIGS. 28 and 29, a plurality of high voltage transistors formed on the active region may be electrically connected with each other. A structure of each of the high voltage transistors may be substantially the same a structure of the high voltage transistor as illustrated with reference to FIG. 20.

Referring to FIGS. 28 and 29, a plurality of gate structures 130 extending in a second direction may be formed on the substrate 100. The plurality of gate structures 130 may be spaced apart from each other in a first direction.

In exemplary embodiments of the present disclosure, the first impurity region 136a may be a common impurity region of two high voltage transistors connected in the first direction. In exemplary embodiments of the present disclosure, the two high voltage transistors may be symmetric with respect to a straight line in a second direction passing the first impurity region 136a. In this case, the first impurity region 136a may be disposed between the first barrier insulation patterns 116a in the two high voltage transistors.

In exemplary embodiments of the present disclosure, the third impurity region 136b may be formed between the second sidewall of the gate structure 130 and the isolation pattern 114a.

The first contact plug 142a may be formed on an upper surface of the first impurity region 136a. The second contact plug 142b may be formed on an upper surface of the third impurity region 136b.

Figure 30:
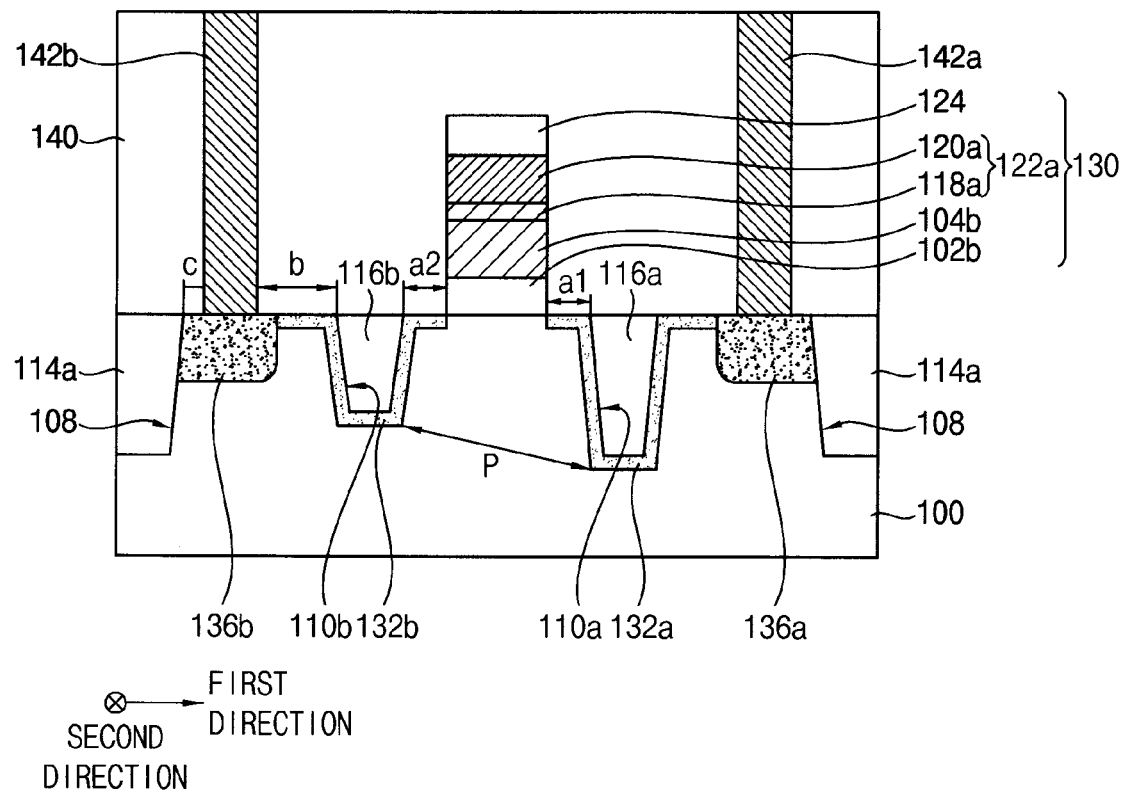
FIG. 30 is a cross-sectional view illustrating a high voltage transistor in accordance with exemplary embodiments of the present disclosure.

FIG. 30 is a cross-sectional view illustrating a high voltage transistor in accordance with exemplary embodiments of the present disclosure.

The transistor shown in FIG. 30 is substantially the same as the high voltage transistor shown in FIG. 1, except for barrier insulation patterns.

Referring to FIG. 30, the high voltage transistor may include the gate structure 130, the first barrier insulation pattern 116a, the second battier insulation pattern 116b and impurity regions 136a, 132a, 136b and 132b. The insulating interlayer 140 may cover the high voltage transistor. The first and second contact plugs 142a and 142b may be formed through the insulating interlayer 140. The first and second contact plugs 142a and 142b may contact at least a portion of the impurity regions 136a, 132a, 136b and 132b.

The substrate 100 may include the first trench 110a to be spaced apart from the first sidewall of the gate structure 130 in the first direction. The first barrier insulation pattern 116a may be formed in the first trench 110a.

The substrate 100 tray include the second trench 110b to be spaced apart from the second sidewall of the gate structure 130 in the first direction. The second barrier insulation pattern 116b may be formed in the second trench 110b.

In exemplary embodiments of the present disclosure, a depth of the second trench 110b may be different from a depth of the first trench 110a. For example, the depth of the second trench 110b may be smaller than the depth of the first trench 110a. For example, a bottom of the first trench 110a and a bottom of the second trench 110b might not be coplanar with each other. Thus, the bottom of the first barrier insulation pattern 116a and the bottom of the second barrier insulation pattern 116b may be positioned on different planes.

Thus, the first and second barrier insulation patterns 116a and 116b may be asymmetric with respect to the gate structure 130.

The impurity regions may include the first impurity region 136a, the second impurity region 132a, the third impurity region 136b and the fourth impurity region 132b.

The first impurity region 136a may be formed under a surface of the substrate 100 in the active region between the first barrier insulation pattern 116a and the isolation pattern 114a. The second impurity region 132a may be formed within the substrate along the surface of the first trench 110a in which the first barrier insulation pattern 116a is formed. The first and second impurity regions 136a and 132a may be connected to each other.

The third impurity region 136b may be formed under the surface of the substrate 100 in the active region between the second barrier insulation pattern 116b and the isolation pattern 114a. The fourth impurity region 132b may be formed within the substrate 100 along the surface of the second trench 110b in which the second barrier insulation pattern 116b is formed. The third and fourth impurity regions 136b and 132b may be connected to each other.

As a height of the bottom of the first barrier insulation pattern 116a and a height of the bottom of the second barrier insulation pattern 116b are different from each other, the second impurity region 132a under the bottom of the first barrier insulation pattern 116a and the fourth impurity regions 132b under the bottom of the second barrier insulation pattern 116b might not be positioned on the same plane. The second impurity region 132a under the bottom of the first barrier insulation pattern 116a and the fourth impurity region 132b under the bottom of the second barrier insulation pattern 116b may be disposed in an oblique direction. Thus, a distance p between the second impurity region 132a under the bottom of the first barrier insulation pattern 116a and the fourth impurity region 132b under the bottom of the second barrier insulation pattern 116b may be increased. An unwanted channel path generated at a portion between the second impurity region 132a under the bottom of the first barrier insulation pattern 116a and the fourth impurity region 132b under the bottom of the second barrier insulation pattern 116b may decrease. Thus, the punch-through may decrease.

The first contact plug 142a may contact the first impurity region 136a. The second contact plug 142b may contact the third impurity region 136b.

FIGS. 31 to 34 are cross-sectional views illustrating stages of a method of manufacturing a vertical semiconductor device in accordance with exemplary embodiments of the present disclosure.

Figure 31:
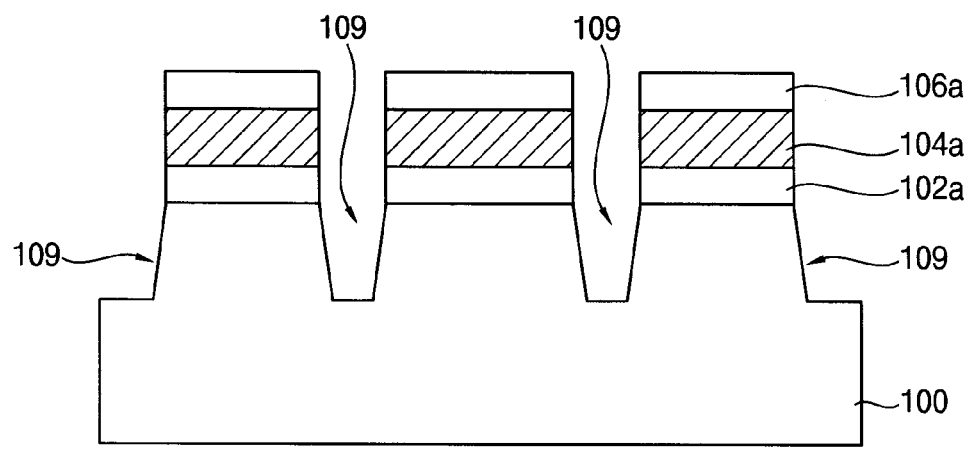
FIGS. 31 to 34 are cross-sectional views illustrating stages of a method of manufacturing a vertical semiconductor device in accordance with exemplary embodiments of the present disclosure.

Referring to FIG. 31, a gate insulation layer, a first gate layer, and a first mask layer may be formed on the substrate 100 including a memory cell region and a peripheral region.

The first mask layer may be patterned to form the first mask pattern 106a.

The first gate layer, the gate insulation layer and the substrate 100 may be etched using the first mask pattern 106a as an etching mask to form preliminary trenches 109. Also, the first gate layer and the gate insulation layer may be patterned by the etching process, so that the preliminary first gate pattern 104a and the preliminary gate insulation patter 102a may be formed.

The preliminary trenches 109 may be formed at regions for forming an isolation region and the first and second trenches in the substrate 100.

Figure 32:
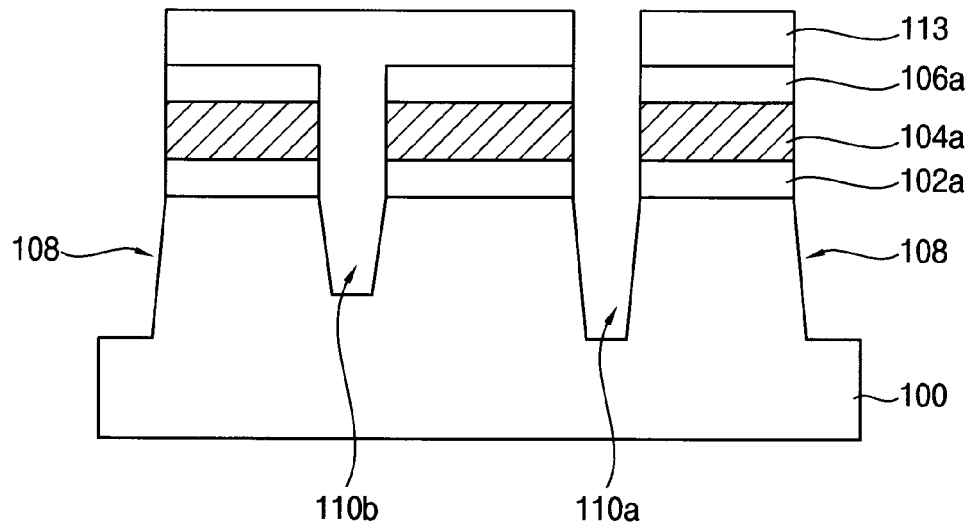

Referring to FIG. 32, a mask pattern 113 exposing ones of preliminary trenches 109 may be formed on the first mask pattern 106a.

The mask pattern 113 may expose portions of the preliminary trenches 109 in which an isolation trench and the first trench are subsequently formed. Also, the mask pattern 113 may cover portions of the preliminary trench 109 where the second trench is subsequently formed. For example, the mask pattern 113 may selectively expose portions where an isolation pattern and a first barrier insulation pattern are subsequently formed.

Thereafter, the substrate 100 may be etched using the mask pattern 113 as an etching mask. Thus, ones of the preliminary trenches 109 of the substrate 100 may be further etched to form the isolation trenches 108 and the first trench 110a. Also, a non-etched preliminary trench may serve as the second trench 110b.

Figure 33:
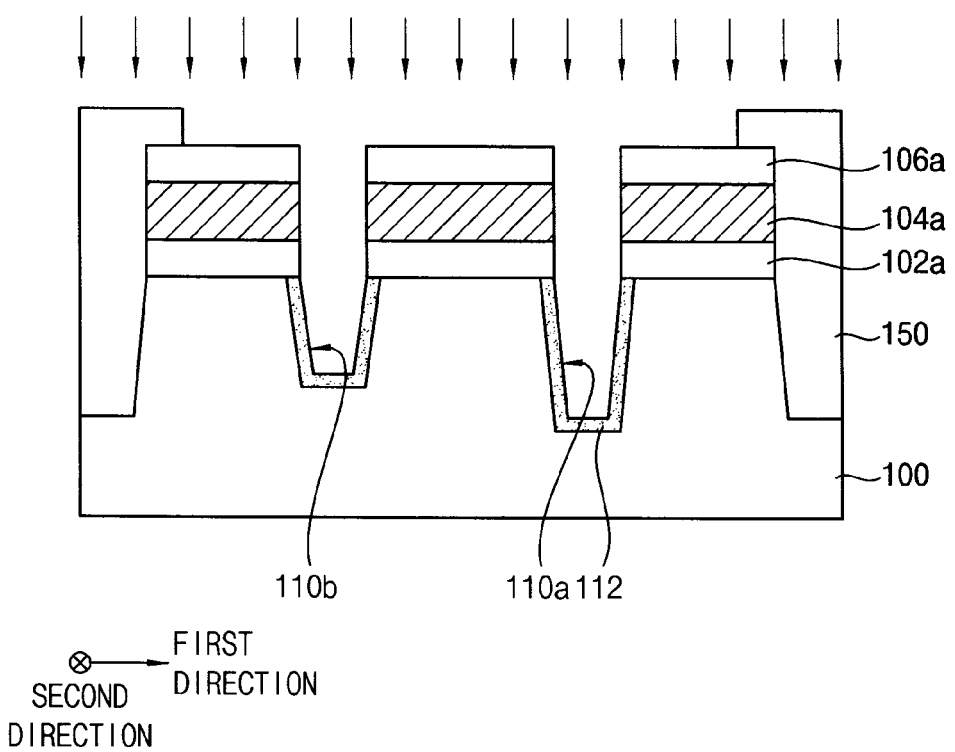

Referring to FIG. 33, a second mask pattern 150 may cover the isolation trenches 108 and a memory cell region and to expose the first and second trenches 110a and 110b.

Impurities may be implanted (or doped) along surfaces of the first and second trenches 110a and 110b exposed by the second mask pattern 150 to form a preliminary first impurity region 112. Thereafter, the second mask pattern 150 may be removed.

Figure 34:
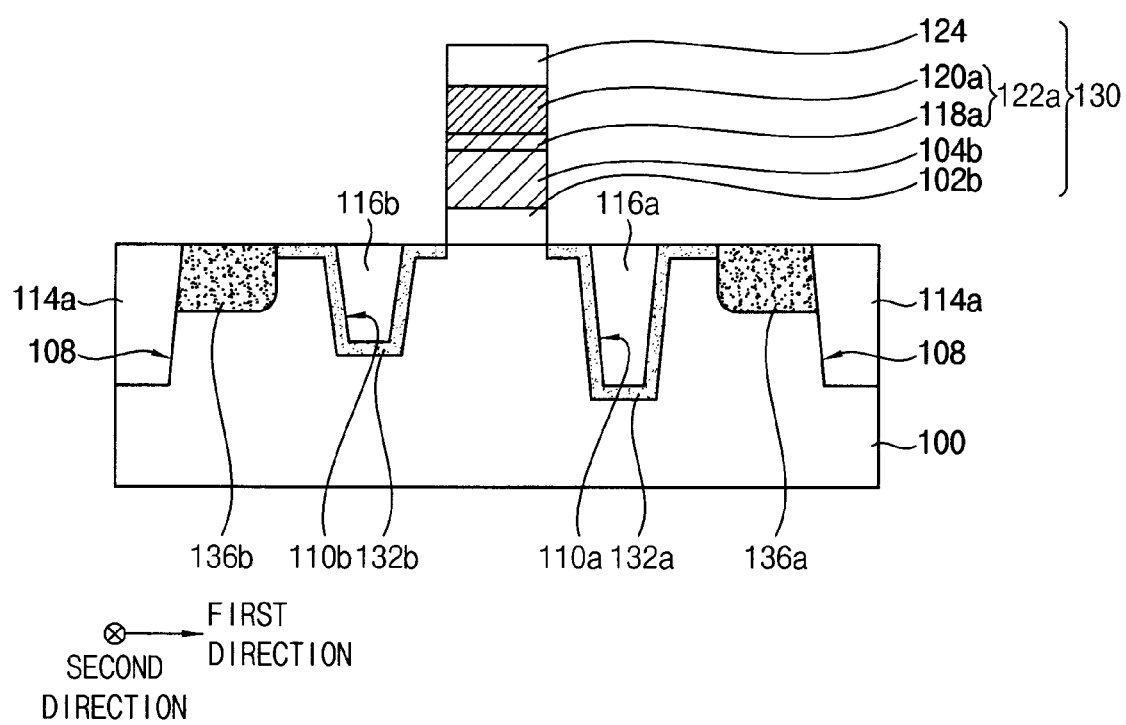

Referring to FIG. 34, the processes substantially the same as illustrated with reference to FIGS. 12 to 16 may be performed. Thus, the first and second barrier insulation patterns 116a and 116b may be formed in the first and second trenches 110a and 110b, respectively. Also, the first to fourth impurity regions 136a, 132a, 136b, and 132b may be formed within the substrate 100 adjacent to sides of the gate structure 130.

Referring to FIG. 30 again, the first and second contact plugs 142a and 142b may contact the first and third impurity regions 136a and 136b, respectively.

Figure 35:
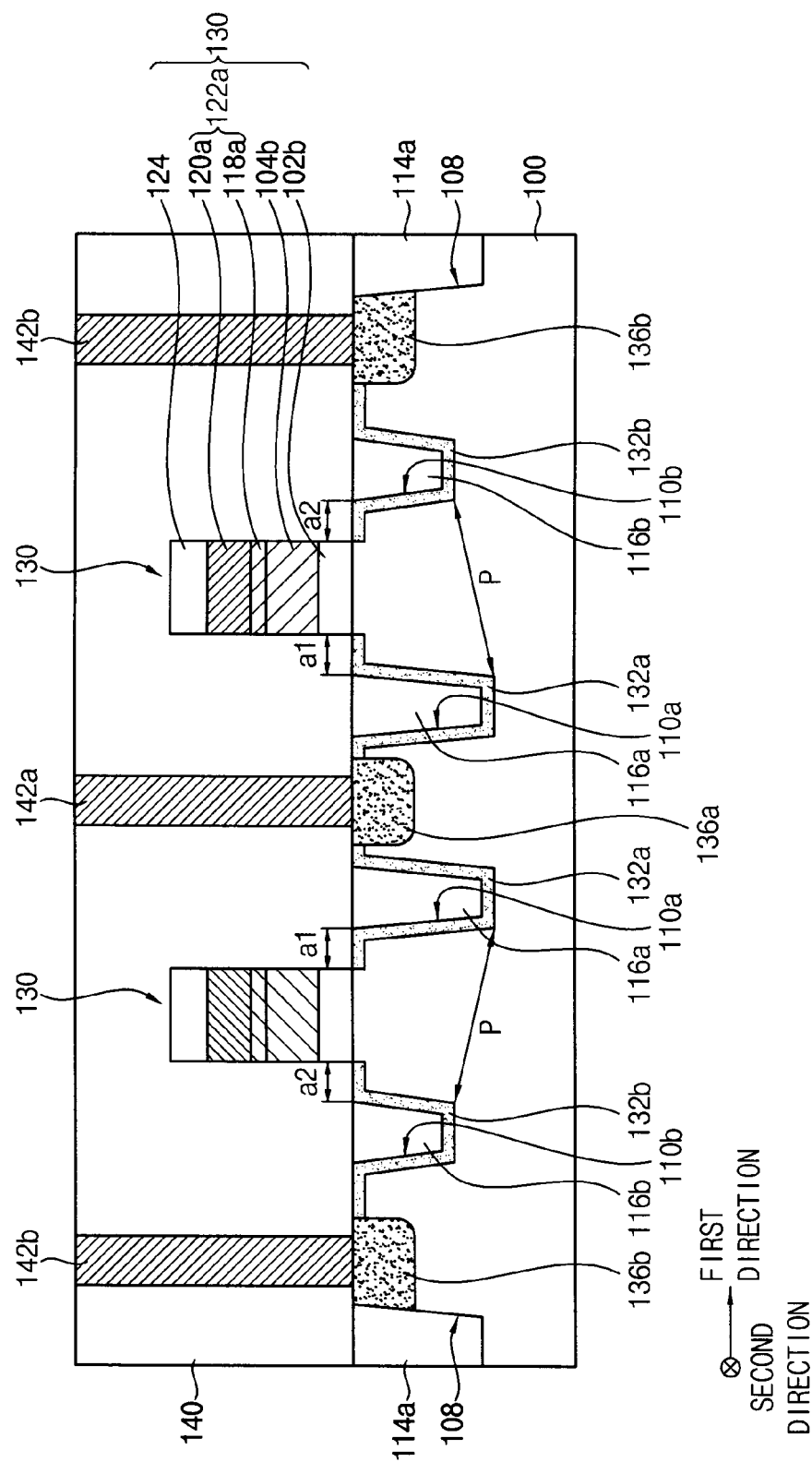
FIG. 35 is a cross-sectional view illustrating a high voltage transistor in accordance with exemplary embodiments of the present disclosure.
Figure 36:
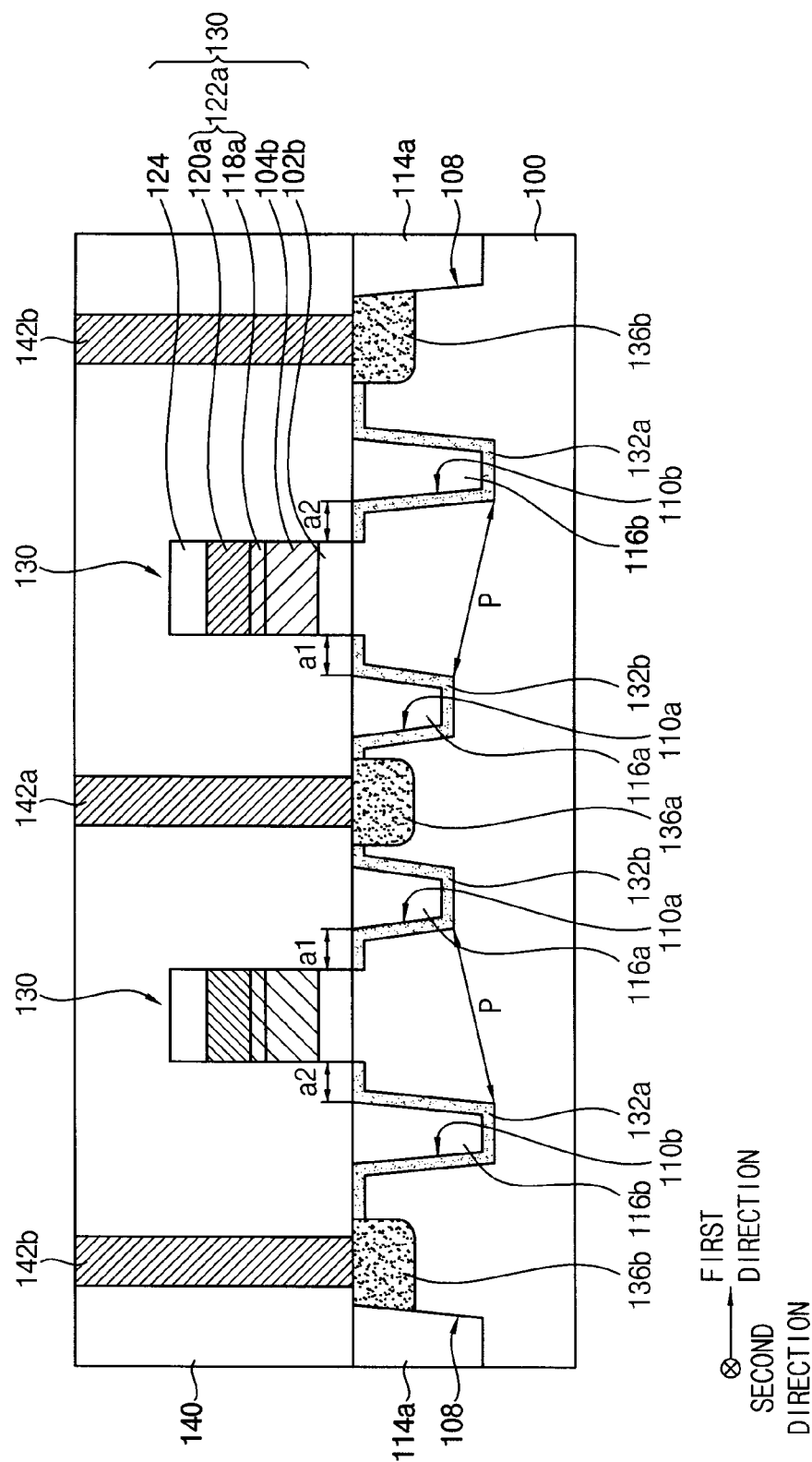
FIG. 36 is a cross-sectional view illustrating a high voltage transistor in accordance with exemplary embodiments of the present disclosure.

FIG. 35 is a cross-sectional view illustrating a high voltage transistor in accordance with exemplary embodiments of the present disclosure. FIG. 36 is a cross-sectional view illustrating a high voltage transistor in accordance with exemplary embodiments of the present disclosure.

In each of FIGS. 35 and 36, a plurality of high voltage transistors formed in an active region may be electrically connected to each other. A structure of each of the high voltage transistors may be substantially the same as a structure of the high voltage transistor illustrated with reference to FIG. 30.

Referring to FIG. 35, a plurality of gate structures 130 extending in a second direction may be formed on the substrate 100. The plurality of gate structures 130 may be spaced apart from each other in the first direction.

The first trench 110a may be formed between neighboring gate structures 130 in the first direction. Thus, the first barrier insulation pattern 116a may be formed between the neighboring gate structures 130 in the first direction.

In exemplary embodiments of the present disclosure, the first impurity region 136a may be a common impurity region of two high voltage transistors connected with each other in the first direction. In exemplary embodiments of the present disclosure, the two high voltage transistors may be symmetric with respect to a straight line in the second direction passing the first impurity region 136a. In this case, the first impurity region 136a may be disposed between the first barrier insulation patterns 116a in the two high voltage transistors.

In exemplary embodiments of the present disclosure, the second trench 110b may be spaced apart from the second sidewall of the gate structure 130. The second barrier insulation pattern 116b may be formed in the second trench 110b.

In exemplary embodiments of the present disclosure, the third impurity region 136b may be formed between the second barrier insulation pattern 116b and the isolation pattern 114a.

In exemplary embodiments of the present disclosure, a bottom of the second barrier insulation pattern 116b may be higher than a bottom of the first barrier insulation pattern 116a.

In some exemplary embodiments of the present disclosure, as shown in FIG. 36, a bottom of the second barrier insulation pattern 116b may be lower than a bottom of the first barrier insulation pattern 116.

The first contact plug 142a may be formed on an upper surface of the first impurity region 136a. The second contact plug 142b may be formed on an upper surface of the third impurity region 136b.

Figure 37:
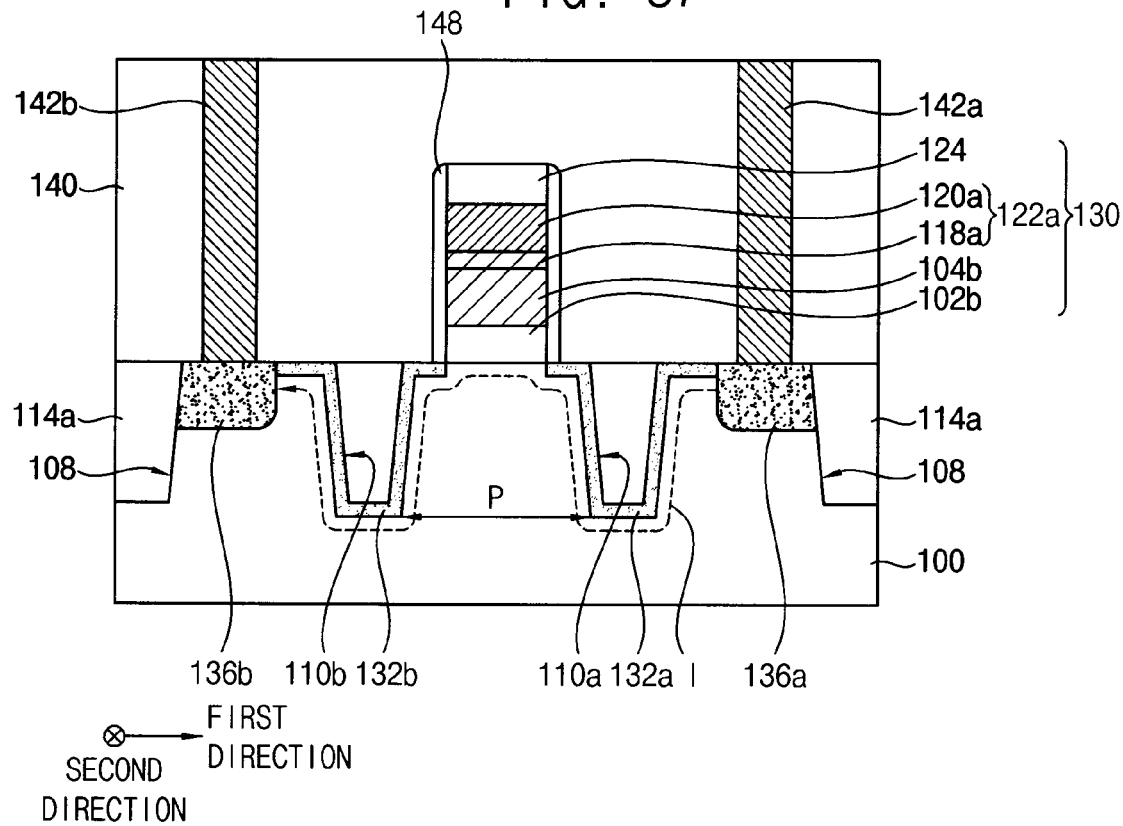
FIGS. 37 to 39 are cross-sectional views illustrating high voltage transistors in accordance with exemplary embodiments of the present disclosure, respectively.
Figure 38:
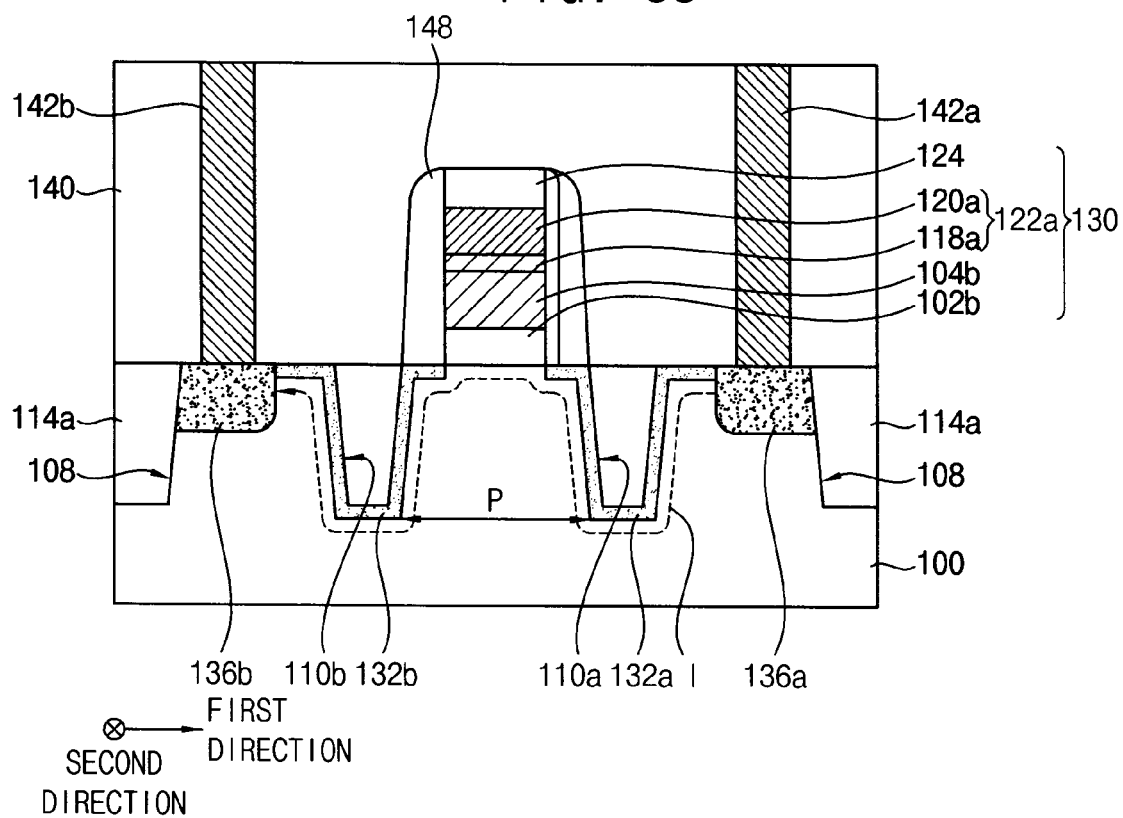
Figure 39:
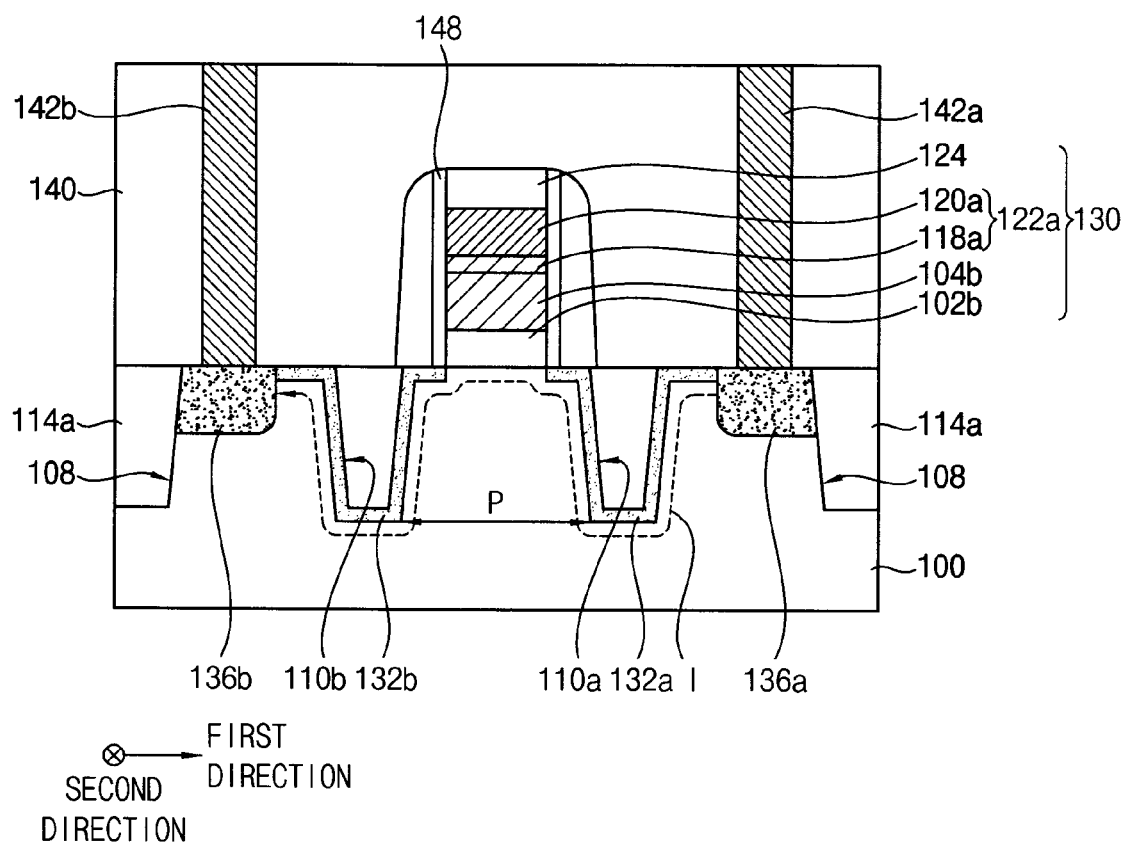

FIGS. 37 to 39 are cross-sectional views illustrating high voltage transistors in accordance with exemplary embodiments of the present disclosure, respectively.

Each of high voltage transistors shown in FIGS. 37 to 39 may be substantially the same as the high voltage transistor illustrated in FIG. 1, except that insulation spacers are further formed on sidewalls of the gate structure.

In each of the transistors illustrated in FIGS. 37 to 39, the insulation spacers may include, e.g., silicon nitride or silicon oxide. The insulation spacers may include one layer multi layers.

Referring to FIG. 37, bottoms of the insulation spacers 148 formed on the sidewalk of the gate structure 130 might not overlap upper portions of the first and second trenches 110a and 110b, respectively. As shown in FIG. 37, each of the first and second trenches 110a and 110b may be spaced apart from the sidewall of the insulation spacer 148. Thus, the sidewall of the insulation spacer on the first sidewall of the gate structure 130 and the first trench 110a may be spaced apart from each other, and the sidewall of the insulation spacer 148 on the second sidewall of the gate structure 130 and the second trench 110b may be spaced apart from each other.

Referring to FIG. 38, bottoms of the insulation spacers 148 formed on the sidewalls of the gate structure 130 might not overlap upper portions of the first and second trenches 110a and 110b, respectively. As shown in FIG. 38, a sidewall of the insulation spacer 148 and a sidewall of the first trench 110a may be aligned with each other, and a sidewall of the insulation spacer 148 and a sidewall of the second trench 110b may be aligned with each other. Thus, the sidewall of the insulation spacer 148 formed on the first sidewall of the gate structure 130 and the first trench 110a might not be spaced apart from each other. The sidewall of the insulation spacer 148 formed on the second sidewall of the gate structure 130 and the second trench 110b might not be spaced apart from each other.

Referring to FIG. 39, bottoms of the insulation spacers 148 formed on the sidewalls of the gate structure 130 may overlap upper portions of the first and second trenches 110a and 110b, respectively. As shown in FIG. 39, the bottom of the insulation spacer 148 formed on the first sidewall of the gate structure 130 may partially cover an upper portion of the first trench 110a. Also, the bottom of the insulation spacer 148 formed on the second sidewall of the gate structure 130 may partially cover an upper portion of the second trench 110b.

The processes of manufacturing the high voltage transistors may be substantially the same as illustrated with reference to FIGS. 9 to 17. However, after performing the process illustrated with reference to FIG. 15, an insulation spacer layer may be further formed on the surfaces of the substrate 100 and the gate structure, and the insulation spacer layer may be anisotropically etched. Thus, the insulation spacers may be formed on sidewalls of the gate structure.

In each of the high voltage transistors in accordance with exemplary embodiments of the present disclosure described above, the insulation spacers may be further formed on the sidewalls of the gate structure.

Figure 40:
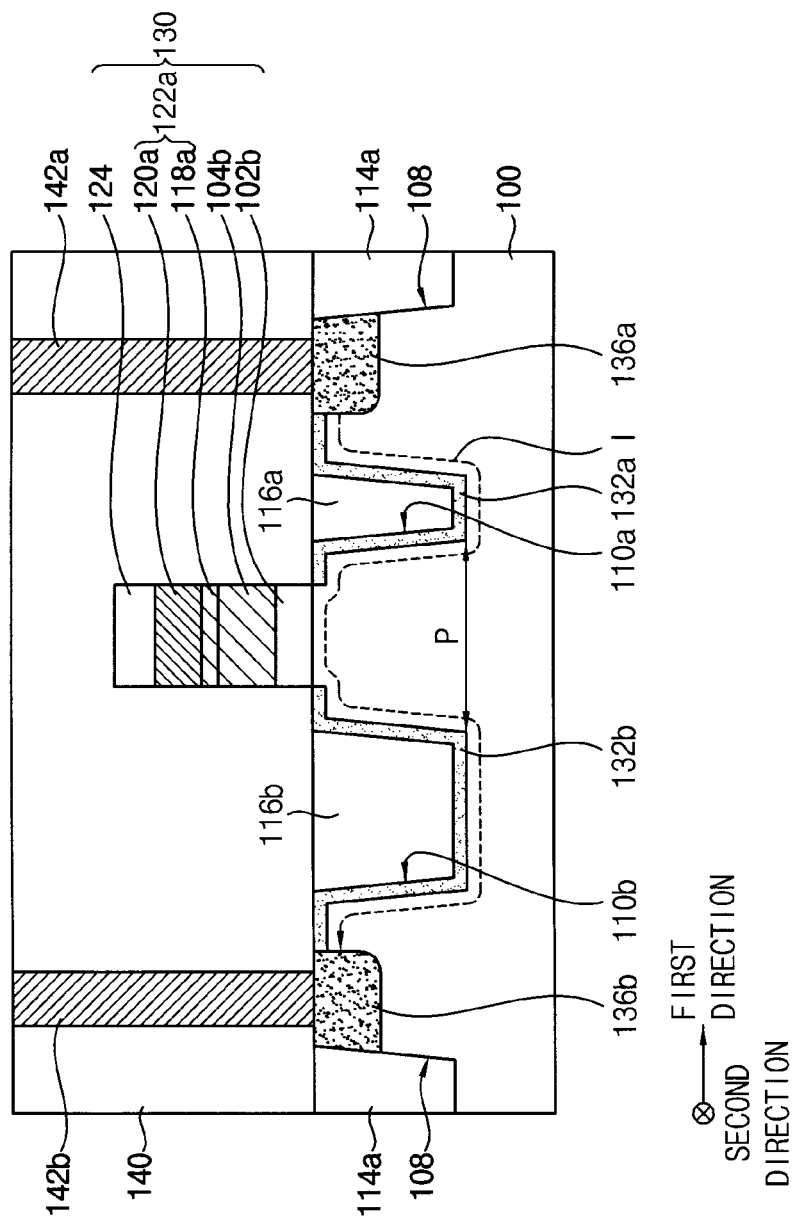
FIG. 40 is a cross-sectional view illustrating high voltage transistors in accordance with exemplary embodiments of the present disclosure.

FIG. 40 is a cross-sectional view illustrating high voltage transistors in accordance with exemplary embodiments of the present disclosure.

The transistor shown in FIG. 40 may be substantially the same as the transistor shown in FIG. 1, except for inner widths of the first and second trenches.

Referring to FIG. 40, an inner width of the first trench 110*a* may be different from an inner width of the second trench 110*b*. Thus, a width of the first barrier insulation pattern 116*a* may be different from a width of the second barrier insulation pattern 116*b*.

For example, the second trench 110*b* ma have the inner width greater than that of the first trench 110*a*. In this case, the second barrier insulation pattern 116*b* may have a width greater than that of the first barrier insulation pattern 116*a*. In each of the high voltage transistors in accordance with exemplary embodiments of the present disclosure described above, the first and second barrier insulation patterns 116*a* and 116*b* may have different widths.

The foregoing is illustrative of exemplary embodiments of the present disclosure and is not to be construed as limiting thereof. Although a few exemplary embodiments of the present disclosure have been described, those skilled in the art will readily appreciate that many modifications are possible in the exemplary embodiments of the present disclosure without materially departing from the novel teachings and aspects of the present inventive concept. Accordingly, all such modifications are intended to be included within the scope of the present inventive concept.

What is claimed is:

1. A semiconductor device, comprising:
a gate structure disposed on a substrate, the gate structure having a first sidewall and a second sidewall facing the first sidewall;
a first impurity region disposed within an upper portion of the substrate, the first impurity region being spaced apart from the first sidewall;
a third impurity region disposed within the upper portion of the substrate, the third impurity region being spaced apart from the second sidewall;
a first trench disposed within the substrate between the first sidewall and the first impurity region, the first trench being spaced apart from the first sidewall;
a first barrier insulation pattern disposed in the first trench;
a second trench disposed within the substrate between the second sidewall and the third impurity region, the second trench being spaced apart from the second sidewall; and
a second barrier insulation pattern disposed in the second trench,
wherein the first impurity region constitutes a first source/drain region,
wherein the third impurity region constitutes a second source/drain region,
wherein the first trench, that is spaced apart from the first sidewall, is disposed between the gate and the first source/drain region,
wherein the second trench, that is spaced apart from the second sidewall, is disposed between the gate and the second source/drain region,
a second impurity region formed within the substrate between the first sidewall and the first impurity region and extending along a surface of the first trench, the second impurity region being connected to the first impurity region and having at least one horizontal section that is disposed between the first trench and the first sidewall or between the first trench and the first impurity region, and
a fourth impurity region formed within the substrate between the second sidewall and the third impurity region and extending along a surface of the second trench, the fourth impurity region being connected to the third impurity region and having at least one horizontal section that is disposed between the second trench and the second sidewall or between the second trench and the third impurity region.

2. The semiconductor device of claim 1, wherein the second impurity region is formed along a surface of the substrate contacting the first harrier insulation pattern.

3. The semiconductor device of claim 1, wherein impurity concentrations of the first and third impurity regions are higher than impurity concentrations of the second and fourth impurity regions.

4. The semiconductor device of claim 1, wherein the first, second, third and fourth impurity, regions are all doped with impurities having a same conductivity type.

5. The semiconductor device of claim 1, wherein the fourth impurity region is formed along the substrate under the surface of the second barrier insulation pattern.

6. The semiconductor device of claim 1, wherein a distance between the first sidewall and the first trench is the same as a distance between the second sidewall and the second trench.

7. The semiconductor device of claim 1, wherein an upper surface of the substrate between the second sidewall and the third impurity region is flat.

8. The semiconductor device of claim 1, wherein the gate structure includes a gate insulation pattern and a gate pattern stacked on the gate insulation pattern.

9. The semiconductor device of claim 1, wherein the substrate further includes an isolation pattern, and the first impurity region and/or third impurity region contacts the isolation pattern.

10. The semiconductor device of claim 1, further comprising a spacer formed on the first sidewall of the gate structure.

11. The semiconductor device of claim 1, wherein a bottom of the spacer is overlapped by an upper portion of the first trench, or is not overlapped by the upper portion of the first trench.

12. A semiconductor device, comprising:
a gate structure formed on a substrate,
a first impurity region formed within the substrate, the first impurity region being spaced apart from a first sidewall of the gate structure;
a second purity region formed within the substrate between the first sidewall and the first impurity region, the second impurity region being connected to the first impurity region;
a third impurity region formed within the substrate, the third impurity region being spaced apart from a second sidewall facing the first sidewall of the gate structure;
a fourth impurity region formed within the substrate, between the second sidewall and the third impurity region, the fourth impurity region being connected to the third impurity region; and
a first barrier insulation pattern filling a first trench formed within the substrate, between the first sidewall and the first impurity region;

a second trench formed within the substrate between the second sidewall and the third impurity region, the second trench being spaced apart from the second sidewall; and a second barrier insulation pattern disposed in the second trench, wherein the first barrier insulation pattern is spaced apart from the first sidewall of the gate structure, and the second impurity region is formed along a surface of the substrate contacting the first barrier insulation pattern, wherein the first impurity region constitutes a first source/drain regions, wherein the third impurity region constitutes a second source/drain region, wherein the first trench, that is spaced apart from the first sidewall, is disposed between the gate and the first source/drain region, wherein the second trench, that is spaced apart from the second sidewall, is disposed between the gate and the second source/drain region, wherein the second impurity region extends along a surface of the first trench and has at least one horizontal section that is disposed between the first trench and the first sidewall or between the first trench and the first impurity region, and wherein the fourth impurity region extends along a surface of the second trench and has at least one horizontal section that is disposed between the second trench and the second sidewall or between the second trench and the third impurity region.

13. The semiconductor device of claim 12, wherein the fourth impurity region is formed at an upper flat portion of the substrate between the second sidewall of the gate structure and the third impurity region.

14. The semiconductor device of claim 12, wherein the fourth impurity region is formed along the surface of the substrate contacting the surface of the second barrier insulation pattern.

15. The semiconductor device of claim 14, wherein a bottom of the first barrier insulation pattern and a bottom of the second barrier insulation pattern are positioned on different planes.

16. A semiconductor device, comprising:

a gate structure formed on the substrate;

a first impurity region formed at an upper portion of the substrate, the first impurity region being spaced apart from a first sidewall of the gate structure;

a second impurity region formed within the substrate, between the first sidewall and the first impurity region, the second impurity region being connected to the first impurity region;

a third impurity region formed at an upper portion of the substrate, the third impurity region being spaced apart from a second sidewall facing the first sidewall of the gate structure;

a fourth impurity region formed within the substrate between the second sidewall and the third impurity region, the fourth impurity region being connected to the third impurity region;

a first barrier insulation pattern filling a first trench formed within the substrate between the first sidewall and the first impurity region;

an insulating interlayer at least partially covering the gate structure on the substrate;

first and second contact plugs passing through the insulating interlayer, the first and second contact plugs contacting the first impurity region and the third impurity region, respectively;

a second trench formed within the substrate between the second sidewall and the third impurity region, the second trench being spaced apart from the second sidewall; and a second barrier insulation pattern disposed in the second trench, wherein the first barrier insulation pattern is spaced apart from the first side wall, and the first to fourth impurity regions are all doped with impurities of the same conductivity type, wherein the first impurity region constitutes a first source/drain regions, wherein the third impurity region constitutes a second source/drain region, wherein the first trench, that is spaced apart from the first sidewall, is disposed between the gate and the first source/drain region, wherein the second trench, that is spaced apart from the second sidewall, is disposed between the gate and the second source/drain region, wherein the second impurity region extends along a surface of the first trench and has at least one horizontal section that is disposed between the first trench and the first sidewall or between the first trench and the first impurity region, and wherein the fourth impurity region extends along a surface of the second trench and has at least one horizontal section that is disposed between the second trench and the second sidewall or between the second trench and the third impurity region.

17. The semiconductor device of claim 1, wherein the first barrier insulation pattern and the second barrier insulation pattern includes silicon oxide.

* * * * *